(12) United States Patent
Himori

(10) Patent No.: US 8,888,951 B2
(45) Date of Patent: Nov. 18, 2014

(54) PLASMA PROCESSING APPARATUS AND ELECTRODE FOR SAME

(75) Inventor: Shinji Himori, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 413 days.

(21) Appl. No.: 12/718,544

(22) Filed: Mar. 5, 2010

(65) Prior Publication Data

US 2010/0224323 A1 Sep. 9, 2010

Related U.S. Application Data

(60) Provisional application No. 61/242,633, filed on Sep. 15, 2009.

(30) Foreign Application Priority Data

Mar. 6, 2009 (JP) ................................ 2009-053423

(51) Int. Cl.
| | |
|---|---|
| C23C 16/00 | (2006.01) |
| C23F 1/00 | (2006.01) |
| H01L 21/306 | (2006.01) |
| H01J 37/32 | (2006.01) |

(52) U.S. Cl.
CPC ....... *H01J 37/32577* (2013.01); *H01J 37/3255* (2013.01); *H01J 2237/03* (2013.01)
USPC ............ 156/345.47; 156/345.43; 156/345.44; 118/723 EE; 118/723 ER

(58) Field of Classification Search
CPC .................... H01J 37/32532; H01J 37/32541; H01J 37/3255
USPC ............. 156/345.33, 345.34, 345.43–345.47; 118/723 E, 723 ER
See application file for complete search history.

(56) References Cited

U.S. PATENT DOCUMENTS

| | | |
|---|---|---|
| 5,557,215 A | 9/1996 | Saeki et al. |
| 5,716,451 A | 2/1998 | Hama et al. |

(Continued)

FOREIGN PATENT DOCUMENTS

| | | |
|---|---|---|
| CN | 1745463 A | 3/2006 |

(Continued)

OTHER PUBLICATIONS

Office Action issued on Apr. 29, 2011 in the corresponding Chinese Patent Application No. 201010128803.7 (with English Translation).
Chinese Office Action issued Feb. 13, 2012 in Patent Application No. 201010128803.7 with English Translation.

*Primary Examiner* — Rakesh Dhingra
(74) *Attorney, Agent, or Firm* — Rothwell, Figg, Ernst & Manbeck, P.C.

(57) ABSTRACT

A plasma processing apparatus includes a processing chamber that plasma processes a target object therein, first and second electrodes that are provided in the processing chamber to face each other and have a processing space therebetween, and a high frequency power source that is connected to at least one of the first and second electrodes to supply high frequency power to the processing chamber. At least one of the first and second electrodes includes a base formed of a metal, a dielectric material provided at a central portion of a plasma side of the base, and a first resistor provided between the dielectric material and plasma, and formed of a metal with a predetermined pattern.

20 Claims, 19 Drawing Sheets

(56) References Cited

U.S. PATENT DOCUMENTS

| | | |
|---|---|---|
| 7,585,386 B2 | 9/2009 | Okumura et al. |
| 2005/0211384 A1* | 9/2005 | Hayashi ............... 156/345.47 |
| 2005/0276928 A1* | 12/2005 | Okumura et al. ............ 427/446 |
| 2006/0221540 A1* | 10/2006 | Himori et al. ............... 361/234 |
| 2008/0073032 A1 | 3/2008 | Koshiishi et al. |
| 2008/0151467 A1* | 6/2008 | Simpson .................. 361/234 |
| 2009/0025632 A1 | 1/2009 | Buechel et al. |
| 2009/0285998 A1 | 11/2009 | Okumura et al. |

FOREIGN PATENT DOCUMENTS

| | | |
|---|---|---|
| CN | 101123200 A | 2/2008 |
| JP | 2001-298015 A | 10/2001 |
| JP | 2004-363552 | 12/2004 |
| JP | 2005-228973 A | 8/2005 |
| JP | 2008-42115 A | 2/2008 |
| JP | 2008-42117 A | 2/2008 |
| JP | 2008-243973 A | 10/2008 |
| WO | WO 2004/070808 A1 | 8/2004 |

* cited by examiner

<FIRST RESISTOR / PATTERNED RESISTOR>

<FIRST RESISTOR + SECOND RESISTOR / INTEGRATED RESISTOR>

<ELECTRODE WITH CHANGED THICKNESS>

<FIRST RESISTOR / CENTRAL OPENING>

<SHAPE OF DIELECTRIC MATERIAL>

PLASMA PROCESSING APPARATUS AND ELECTRODE FOR SAME

CROSS-REFERENCE TO RELATED APPLICATIONS

This application claims priority to Japanese Patent Application No. 2009-053423 filed on Mar. 6, 2009, the entire contents of which are incorporated herein by reference.

FIELD OF THE INVENTION

The present invention is related to a structure of an electrode used for a plasma processing apparatus and a plasma processing apparatus using same; and, more specifically, to a structure of an electrode for a plasma processing apparatus that may control the distribution of an electric field strength consumed by high frequency power for a generation of plasma between parallel plate type electrodes.

BACKGROUND OF THE INVENTION

As apparatuses become commercially available for performing microprocessing, e.g., etching or film forming, on a target object by plasma action, capacitively coupled (parallel plate type) plasma processing apparatuses, inductively coupled plasma processing apparatuses, and microwave plasma processing apparatuses are commonly utilized. Among these, a parallel plate type plasma processing apparatus applies high frequency power to at least one of an upper electrode and a lower electrode facing each other, to generate electric field energy, thereby exciting a gas to generate plasma, which processes a target object finely.

According to the recent need for miniaturization, it is inevitable to supply relatively high frequency power of, e.g., 100 MHz, to generate high density plasma. As the frequency of power supplied becomes higher, a high frequency current flows along the plasma-side surface of the electrode from its end portion to its central portion due to the skin effect. Such effect causes the electric field strength to be higher at the central portion of the electrode rather than at the end portion of the electrode. Accordingly, the electric field energy consumed for the generation of plasma at the central portion of the electrode is higher than that at the end portion of the electrode, and thus ionization or dissociation of a gas is further accelerated at the central portion of the electrode than at the end portion of the electrode. As a consequence, an electron density Ne at the central portion is higher than that Ne at the end portion. Because a resistivity of the plasma decreases at the central portion of the electrode with a higher electron density Ne, a current with a high frequency (electromagnetic wave) also focuses on the central portion in the facing electrode, thus leading to further nonuniformity of the plasma density.

Accordingly, it has been suggested to bury a dielectric material, e.g., ceramics, in the electrode near the central portion of the plasma-side surface (see, e.g., Japanese Patent Application Publication No. 2004-363552).

It has also been suggested to ensure higher uniformity of a plasma that the dielectric material be formed in a tapered shape or the dielectric material be made thinner in thickness as going from its central portion toward its periphery. FIG. 16 depicts a simulation result of an electric field strength distribution for four different constructions A to D of an upper electrode in a parallel plate type plasma processing apparatus. The construction A of the upper electrode 900 includes a base 905 made of a metal, e.g., aluminum (Al) and an insulation layer 910 made of alumina ($Al_2O_3$) or yttria ($Y_2O_3$) sprayed on the plasma-side surface of the base 905. The construction B of the upper electrode 900 further includes a columnar shaped dielectric material 915 with a dielectric constant ∈ of 10, a diameter of 240 mm, and a thickness of 10 mm, buried in the center of the base 910 in addition to the base 905 and the insulation layer 910. The construction C of the upper electrode 900 includes a tapered dielectric material 915 which is 10 mm thick at its central portion and 3 mm thick at its end portion. The construction D of the upper electrode 900 has a stepped dielectric material 915 that includes a first step with a diameter of 80 mm, a second step with a diameter of 160 mm, and a third step with a diameter of 240 mm. As a result, in a case where there is no dielectric material as shown in "A" of FIG. 16, the electric field strength was higher at the central portion of the electrode than that at the end portion of the electrode. This will be described with reference to FIG. 17A. Assuming that electric field strength distribution is E/Emax when the maximum electric field strength is Emax under each condition, it can be seen that the electric field strength distribution E/Emax at the plasma-side of the electrode 900 becomes dense at the central portion owing to a high frequency current flowing from the end portion of the electrode 900 to the central portion of that.

On the other hand, in a case where the columnar shaped dielectric material 915 shown in "B" of FIG. 16, the electric field strength distribution E/Emax was lowered at the bottom portion of the dielectric material. Referring to FIG. 17B, the capacitance component C of the dielectric material 915 and a sheath capacitance component (not shown) function as a voltage divider and the electric field strength distribution E/Emax is lowered at the central portion of the electrode 900. And, there occurs nonuniformity in electric field strength distribution E/Emax at the end portion of the dielectric material 915.

In a case where a tapered dielectric material 915 is provided as shown in "C" of FIG. 16, there was an improvement in uniformity of electric field strength distribution E/Emax made from the end portion of the electrode toward the central portion of the electrode. Referring to FIG. 17C, it is considered that since the capacitance component was higher at the end portion of the dielectric material 915 than at the central portion of that, the electric field strength distribution E/Emax was not excessively lowered at the end portion of the dielectric material 915 compared to a case where a flat type dielectric material 915 was provided and this allowed a uniform electric field strength distribution.

In a case where there is provided a dielectric material 915 having steps as shown in "D" of FIG. 16, there occurred steps in electric field strength distribution E/Emax as compared to the case where a tapered dielectric material 915 is provided as shown in "C" of FIG. 16. However, this case allowed a more uniform electric field strength distribution than the case where the columnar shaped dielectric material 915 is provided as shown in "B" of FIG. 16. The simulation result showed that the case, where a tapered dielectric material is provided, exhibited the most uniform electric field strength distribution E/Emax and thus this case allowed plasma to be generated most uniformly.

However, it suffers from the following problem to bury the tapered dielectric material 915 in the base 905. An additive or a screw is used to join the dielectric material 915 with the base 905. Since the base 905 is formed of a metal, e.g., aluminum and the dielectric material 915 is formed of ceramics, there occurs a difference in linear heat expansion. In consideration of this, there is a need for providing a proper gap between the members.

If the dielectric material 915 has a tapered shape, the dimensional accuracy is deteriorated at the tapered portion due to a lack of machining accuracy. This results in stress concentration due to a difference in heat expansion. The stress concentration is also caused by a difference in thermal conductivity due to a discrepancy in dimensional tolerance at the mating interface or a discrepancy in thickness of the dielectric material. An adhesive is peeled off from the mating interface due to the stress concentration. Since the difference in thermal expansion coefficient makes it difficult to manage the gap due to a difference in heat expansion, the peeled adhesive escapes from the gap, which causes a contamination in the chamber. Further, among the insulation layer 910 sprayed on the surface of the dielectric material 915 made of ceramic or the like and the insulation layer 910 sprayed on the surface of the base 905 made of aluminum or the like, it is likely for the insulation layer sprayed on the dielectric material made of ceramic or the like to be peeled off due to a difference in adhesive strength. As a result, a contamination in the chamber is also caused by peeling of the material sprayed on the dielectric material 915.

SUMMARY OF THE INVENTION

In view of the above, the present invention provides a plasma processing apparatus that may control an electric field strength distribution at the plasma-side surface of a parallel plate type electrode and an electrode for the plasma processing apparatus.

In accordance with a first embodiment of the present invention, there is provided a plasma processing apparatus including: a processing chamber that plasma processes a target object therein, first and second electrodes that are provided in the processing chamber to face each other and have a processing space therebetween, and a high frequency power source that is connected to at least one of the first and second electrodes to supply high frequency power to the processing chamber, wherein at least one of the first and second electrodes includes: a base formed of a metal; a first dielectric material provided at a central portion of a plasma-side of the base; and a first resistor provided between the first dielectric material and plasma, the first resistor being formed of a metal with a predetermined pattern.

With such configuration, when a high frequency current flows along the metal surface of the base, the high frequency energy is distributed due to capacitance caused by volume of the first dielectric material provided at the central portion of the electrode. As a result, the electric field strength of an electromagnetic field generated by propagation of high frequency current through the central portion of the electrode becomes lower in a case where there is a dielectric material than in a case where there is no dielectric material. In addition, the first resistor with a predetermined pattern is provided between the first dielectric material and plasma. This allows the high frequency current to flow along the skin of the first resistor as well as along the metal surface of the base. The high frequency energy is partially converted into Joule heat due to the resistance of the first resistor while the current flows through the first resistor and the converted Joule heat is consumed, thus creating a potential distribution due to the current and resistance. This makes it possible to gradually lower the high frequency electric field strength at the position where the first resistor is arranged.

As the impedance at the electrode side increases, the electric field energy consumed for plasma decreases. In the electrode according to the present invention, thus, the position and capacitance C of the first dielectric material and the position and resistance R of the first resistor are set so that the impedance at the central portion of the electrode is gradually increased compared to the impedance at the end portion of the electrode. By doing so, it may be possible to make the electric field strength uniform at the bottom portion of the electrode, thereby generating plasma with uniform plasma density Ne.

Further, since there is no need of making the first dielectric material tapered, machining costs may be saved. Due to a discrepancy in dimensional tolerance and difference in thickness of dielectric material, stress concentration conventionally occurred and this caused the adhesive or sprayed material to be peeled off. The peeling was a cause of contamination. In the construction according to the present invention, however, the first dielectric material does not necessarily have a tapered shape, thus capable of reducing peeling of the adhesive or sprayed material and suppressing contamination.

The first dielectric material may be shaped as a plate. The first resistor may be buried in a second dielectric material that is brought in tight contact with a plasma side surface of the first dielectric material.

A sheet resistance of the first resistor may range from 20Ω/☐ to 2000Ω/☐.

The first resistor may have a plurality of ring-shaped members spaced from one another by a predetermined distance therebetween or a plurality of island-shaped members spaced from one another by a predetermined distance therebetween.

The predetermined distance may be set so that an impedance 1/Cω of the distance may be greater than resistance R of the first resistor.

The at least one of the first and second electrodes may further include a second resistor formed of a metal between the first dielectric material and the plasma.

The total sheet resistance of the first resistor and the second resistor may range from 20Ω/☐ to 2000Ω/☐.

A third resistor thinner in thickness than the first resistor may be provided between the members of the first resistor.

High frequency power for generating plasma whose frequency may range from 13 MHz to 100 MHz is supplied to one of the first and second electrodes.

The upper electrode may have the first resistor and a gas feeding pipe passes through a space between the members of the first resistor.

In accordance with a second embodiment of the present invention, there is provided an electrode for use in a plasma processing apparatus that applies high frequency power to the electrode to generate plasma of a gas and performs a plasma processing on a target object by using the generated plasma, wherein the electrode is at least one of first and second electrodes that face each other and have a plasma processing space therebetween, and the electrode includes: a base formed of a metal; a first dielectric material provided at a central portion of a plasma-side of the base; and a first resistor provided between the first dielectric material and plasma, the first resistor being formed of a metal with a predetermined pattern.

The electrode may further include an integrated second resistor provided between the first dielectric material and plasma.

The electrode for a plasma processing apparatus may be a lower electrode and the second resistor may be an electrostatic chuck provided at the lower electrode.

In accordance with a third embodiment of the present invention, there is provided an electrode for use in a plasma processing apparatus that applies high frequency power to the electrode to generate plasma of a gas and performs a plasma processing on a target object by using the generated plasma, wherein the electrode is an upper electrode disposed to face a lower electrode with a plasma processing space defined therebetween, and the electrode includes: a base formed of a metal; a first dielectric material provided at a central portion of a plasma-side of the base; and a first resistor provided between the first dielectric material and the plasma, the first resistor being formed of a metal.

As described above, the present invention may control the electric field strength distribution on the plasma side surface of the parallel plate type electrode.

BRIEF DESCRIPTION OF THE DRAWINGS

The features and objects of the present invention will become apparent from the following description of an embodiment given in conjunction with the accompanying drawing, in which.

DETAILED DESCRIPTION OF THE EMBODIMENTS

Figure 1:
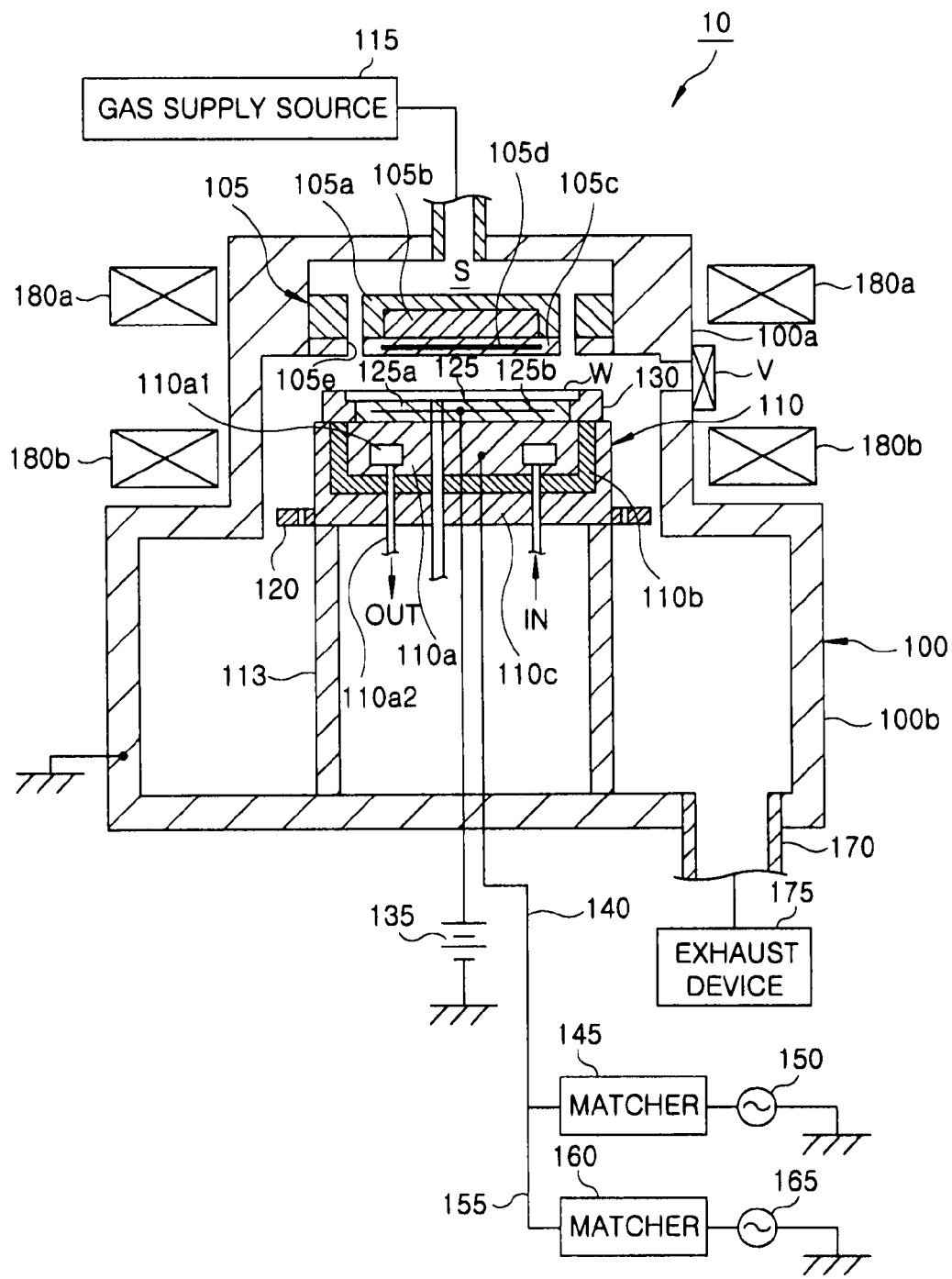
FIG. 1 is a longitudinal cross sectional view illustrating a RIE plasma etching apparatus 10 according to an embodiment of the present invention.

Hereinafter, embodiments of the present invention will be described in detail with reference to accompanying drawings which form a part hereof. Through the specification, like reference numerals refer to like elements and the repetitive descriptions will be omitted.

(1) The Entire Construction of the Plasma Processing Apparatus

First of all, the entire construction of a plasma processing apparatus having an electrode according to an embodiment of the present invention will be described with reference to FIG. 1. FIG. 1 depicts a RIE (Reactive Ion Etching) plasma etching apparatus (parallel plate type plasma processing apparatus) having an electrode according to an embodiment of the present invention. The RIE (Reactive Ion Etching) plasma etching apparatus 10 corresponds to a plasma processing apparatus that generates plasma by a high frequency energy and plasma processes a wafer W.

The RIE plasma etching apparatus 10 includes a processing chamber 100 that plasma processes therein the wafer W loaded from a gate valve V. The processing chamber 100 includes an upper cylindrical chamber 100a with a small diameter and a lower cylindrical chamber 100b with a large diameter. The processing chamber 100 is made of a metal, e.g., aluminum (Al), and grounded.

In the processing chamber, an upper electrode 105 and a lower electrode 110 are arranged to face each other, thus constituting a pair of parallel plate electrodes. The upper electrode 105 includes a base 105a, a first dielectric material 105b, an insulation layer 105c, and a first resistor 105d. The base 105a is formed of a metal, e.g., aluminum, carbon, titanium, tungsten. The first dielectric material 105b is a columnar shaped plate made of ceramics, e.g., alumina, yttria. The first dielectric material 105b is provided at the plasma-side central portion of the base 105a. The base 105a and the first dielectric material 105b are joined to each other by an adhesive.

The insulation layer 105c is formed by spraying alumina or yttria on the bottom surface of the base 105a and the first dielectric material 105b. Upon spraying, the first resistor 105d is buried in the insulation layer 105c at the vicinity of the exposed first dielectric material 105b. The first resistor 105d is a sheet type resistor that has been separated into three ring-shaped members. The first resistor 105d is formed of a metal, e.g., aluminum, carbon, titanium, tungsten. The first resistor 105d may be formed in tight contact with the plasma-side surface of the insulation layer 105c while being exposed from the insulation layer 105c.

Alumina has been sprayed on the surface of the upper electrode 105. The upper electrode 105 has a plurality of gas holes 105e penetrating therethrough, so it may serve as a shower plate as well. Specifically, a gas supplied from a gas supply source 115 is diffused in a gas diffusion space S of the processing chamber and then introduced into the processing chamber through the gas holes 105e. Although the gas holes 105e are provided only at end portions of the upper electrode 105 in FIG. 1, the gas holes 105e may also be provided at the central portion of the upper electrode 105. In this case, the gas holes 105e are provided to penetrate through the base 105a, the first dielectric material 105b, the insulation layer 105c, and the first resistor 105d.

The lower electrode 110 includes a base 110a. The base 110a is formed of a metal, e.g., aluminum, and supported by a support 110c via an insulation layer 110b. Accordingly, the lower electrode 110 is electrically "floated". The support 110c is covered at its bottom portion by a cover 113. A baffle plate 120 is provided at the outer periphery of a lower portion of the support 110c to control the flow of the gas.

A coolant portion 110a1 is provided in the base 110a. A coolant is introduced into the coolant portion 110a1 via a "IN" side of a coolant introduction line 110a2. The coolant is circulated in the coolant portion 110a1 and discharged from the coolant portion 110a1 via an "OUT" side of a coolant introduction line 110a2. By doing so, the base 110a is controlled to have a desired temperature.

An electrostatic chuck mechanism 125 is provided over the top surface of the base 110a to mount thereon a wafer W. A focus ring 130 formed of, e.g., silicon, is provided at the outer periphery of the electrostatic chuck mechanism 125 to maintain uniformity of plasma. The electrostatic chuck mechanism 125 includes an insulation member 125a made of, e.g., alumina, and an electrode part 125b, a metal sheet member, which is interposed in the insulation member 125a. A DC (Direct Current) source 135 is connected to the electrode part 125b. A DC voltage from the DC source 135 is applied to the electrode part 125b so that the wafer W is electrostatically adsorbed to the lower electrode 110.

The base 110a is connected to a first matcher 145 and a first high frequency power supply 150 via a first feeder line 140. A gas in the processing chamber is excited by high frequency electric field energy outputted from the first high frequency power supply 150 to generate discharge plasma by which an etching process is performed on the wafer W.

Figure 2:
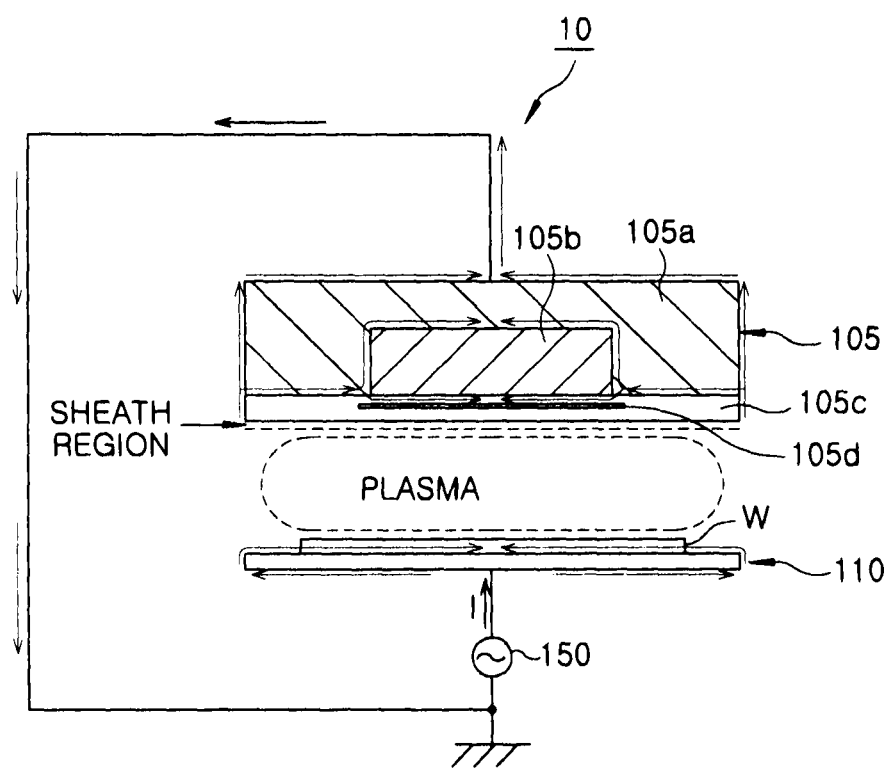
FIG. 2 is a view illustrating a high frequency current with respect to the apparatus.

As shown in FIG. 2, when a high frequency power of, e.g., 100 MHz, is applied from the first high frequency power supply 150 to the lower electrode 110, a high frequency current propagates along the surface of the lower electrode 110 from the end portion of the top surface of the lower electrode 110 to the central portion thereof by skin effect. Accordingly, the electric field strength is higher at the central portion of the lower electrode 110 than at the end portion of the lower electrode 110, thus accelerating ionization or dissociation of the gas at the central portion of the lower electrode 110 than at the end portion of that. As a consequence, the electron density of the plasma Ne is higher at the central portion of the lower electrode 110 than at the end portion of that. As the resistivity of plasma is lower at the central portion of the lower electrode 110, which has a higher electron density of plasma Ne, a high frequency current is concentrated on the central portion of the upper electrode 105 facing the lower electrode 110, thus causing further nonuniformity in density of plasma. In the plasma etching apparatus 10 according to the embodiment, however, the upper electrode 105 includes the first dielectric material 105b and the first resistor 105d. Accordingly, the capacitance component of the first dielectric material 105b and the sheath capacitance component function as a voltage divider, and this may result in uniformity in plasma density by obviating such a phenomenon that the density of plasma is higher at the central portion than at the end portion. This mechanism will be described later. The high frequency current that have propagated along the metal surface of the upper electrode 105 flows through the processing chamber 100 to the ground.

Returning to FIG. 1, a second feeder line 155 split from the first feeder line 140 is connected to a second matcher 160 and a second high frequency power supply 165. A high frequency bias voltage having a frequency of, e.g., 3.2 MHz, outputted from the second high frequency power supply 165 is used for attracting ions into the lower electrode 110.

An exhaust port 170 is provided at a bottom surface of the processing chamber 100 and an exhaust device 175 connected to the exhaust port 170 is driven to maintain the interior of the processing chamber 100 at a desired vacuum state. Multi-pole ring magnets 180a and 180b are arranged around the upper chamber 100a. In the multi-pole ring magnets 180a and 180b, a plurality of anisotropic segment columnar magnets is attached to ring-shaped magnetic material casings and the magnetic pole of each anisotropic segment columnar magnet has an opposite direction of the magnetic pole of another anisotropic segment columnar magnet adjacent thereto. By doing so, magnetic force lines are formed between adjacent segment magnets and a magnetic field is only formed around the processing space between the upper electrode 105 and the lower electrode 110 so that plasma may be trapped within the processing space.

Figure 3:
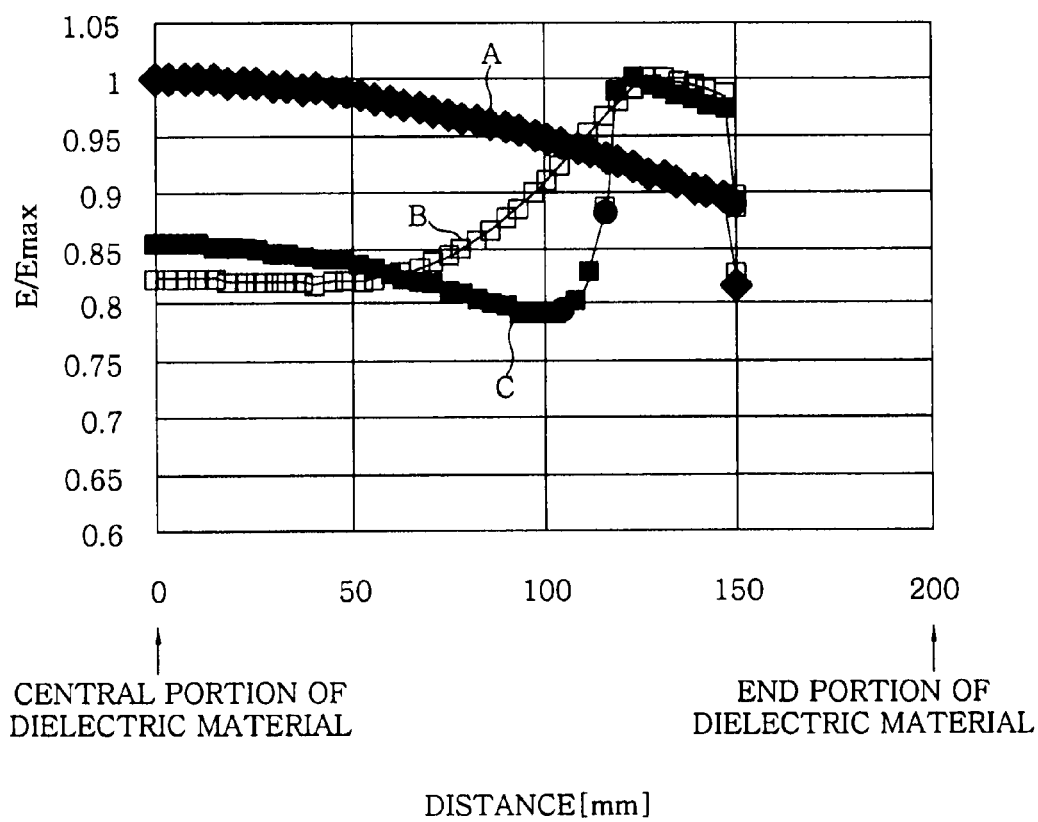
FIG. 3 a graph illustrating an electric field strength distribution according to the value of a resistor.

(2) Relationship Between the Resistor and an Electric Field Strength Distribution Next, functions of the first dielectric material 105b and the first resistor 105d provided in the upper electrode 105 will be described. As described above, the first resistor 105d is buried in the insulation layer 105c (corresponding to the second dielectric material) near the plasma-side surface of the first dielectric material 105b. The first resistor 105d affects electric field strength distribution at the bottom portion of the upper electrode 105 as follows. To prove these effects, a simulation result by the inventors is shown in FIG. 3. As a condition for the simulations, resistivity p of plasma was set to 1.5 $\Omega$m throughout the entire simulations. And, the frequency of a high frequency power supplied was set to 100 MHz unless otherwise mentioned. Further, the sheet resistance of the resistor is represented as resistance per unit area ($\Omega/\square$) of a sheet type resistor.

The inventors performed simulations on a case where neither the first dielectric material 105b nor the first resistor 105d are present, a case where the first resistor 105d has a low resistance (0.002 $\Omega/\square$, 2$\Omega/\square$), a case where the first resistor 105d has a middle resistance (200Ω/☐), and a case where the first resistance 105d has a high resistance (20,000Ω/☐).

(2-1) in a Case that Neither a Dielectric Nor a Resistor are Present

Before the operation and effects of the upper electrode 105 according to the embodiment are described, there will be described an electric field strength distribution in a case of the conventional electrode (FIG. 17A) that includes neither the first dielectric material 105b nor the first resistor 105d. Hereinafter, the electric field strength distribution is represented as E/Emax when the maximum value of an electric field strength under each condition is Emax. As is apparent from the simulation results of the case where neither dielectric material nor resistor are present which belongs to group A in FIG. 3, the electric field strength distribution E/Emax at the bottom portion of the upper electrode becomes dense at its central portion with respect to the high frequency current flowing from the end portion of the upper electrode 900 to the central portion of that.

(2-2) In a Case that the Resistor is Absent

In the conventional case where the dielectric material 915 is only provided without the resistor (FIG. 17B), the electric field strength distribution E/Emax is lowered at the central portion of the upper electrode 900 as compared to the case where neither dielectric material nor resistor are present. According to the finding when the high frequency current flows along the metal surface of the upper electrode 900, a voltage divider occurs due to the capacitance component by the dielectric material 915 provided at the central portion of the upper electrode 900 and the sheath capacitance component, and high frequency electric field strength is distributed at the bottom portion of the dielectric material.

Figure 16:
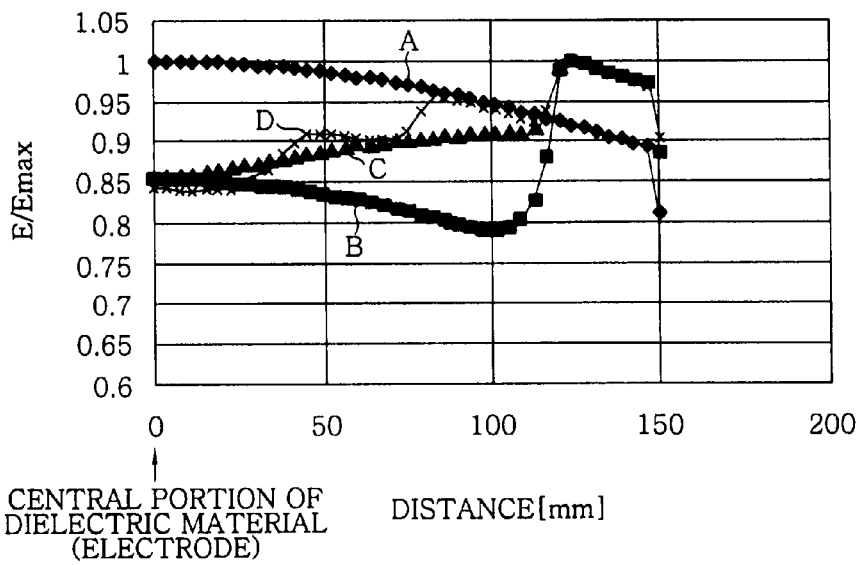
FIG. 16 is a graph and views illustrating an electric field distribution where the shape of the dielectric material has been changed according to the prior art.
Figure 16:
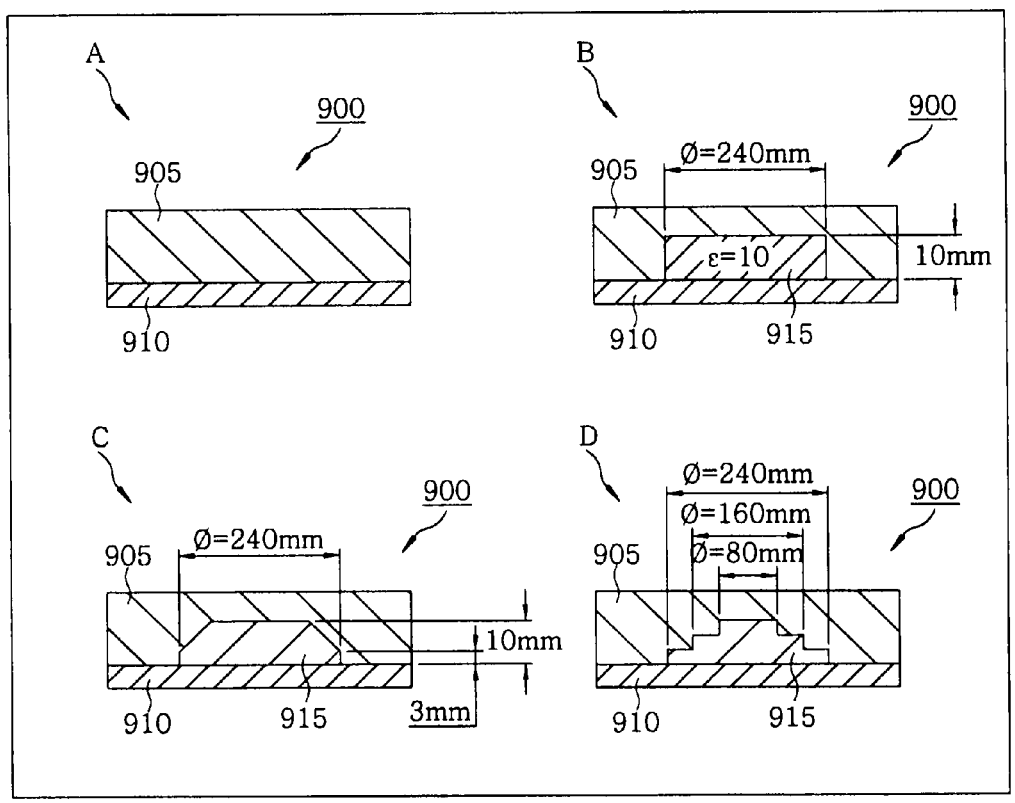
Figure 17A:
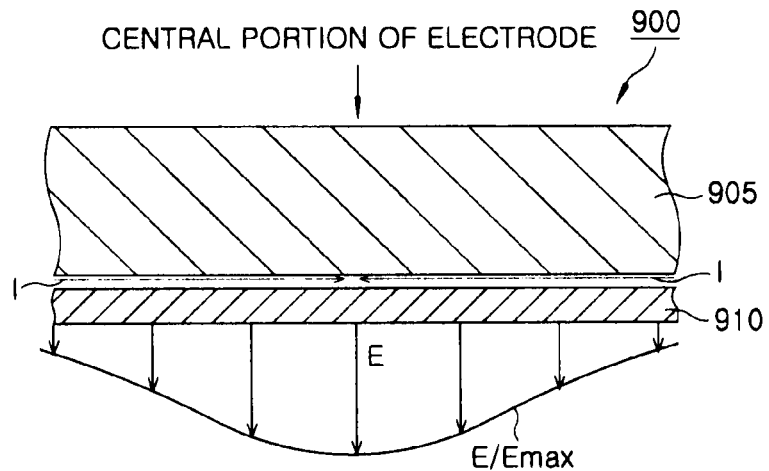
FIG. 17A is a view illustrating an electric field strength distribution where neither a dielectric material nor a resistor are provided according to the prior art.

It has been already developed and well known in the art to make the dielectric material tapered in order to improve the electric field strength distribution as shown in FIG. 16C. In this case, uniformity in electric field strength distribution E/Emax from the end portion of the upper electrode 900 toward the central portion of that was improved as shown in FIG. 17C. This result is considered to be obtained because the capacitance component C was further increased at the end portions of the dielectric material 915 than at the central portions of that and thus, a uniform distribution was obtained without the electric field strength distribution E/Emax being excessively lowered at the end portions of the dielectric material 915, as compared to the case where a flat dielectric material 915 is provided.

However, if the dielectric material 915 is formed in the tapered shape, thermal expansion difference of the dielectric material is increased respective to the aluminum base, stress is focused on the mating surface, and a discrepancy in heat conductivity due to a discrepancy in dimensional tolerance occurs at the mating interface, thus causing a contamination at the gap of the mating surface. Further, difference between the dielectric material surface and the metal surface leads to a difference in adhering property of spray and this peels off the sprayed material. This may be a cause of contamination in the chamber and lower production yield. Accordingly, the inventors buried the first resistor 105d in the insulation layer 105c in addition to the flat-shaped first dielectric material 105b instead of making the dielectric material 915 tapered. The operation and effects of the first resistor 105d will now be described.

(2-3) In a Case that the Resistor has a Low Resistance

Figure 4A:
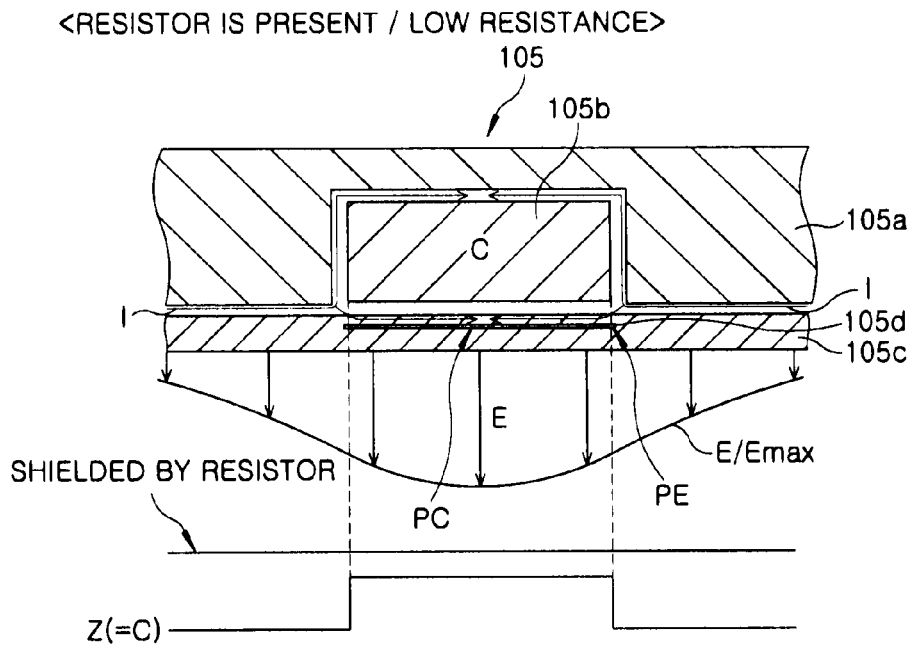
FIG. 4A is a view illustrating an electric field strength distribution in a case where there is provided a resistor with a low resistance.

As shown in the simulation result in FIG. 3, a case where the first resistor 105 has a low resistance (0.002Ω/☐, 2Ω/☐) belongs to group A similarly to the case where neither dielectric material nor resistor are present. In this case, as shown in FIG. 4A, the high frequency current I flows along the metal surface of the base 105a of the upper electrode 105 from the end portion toward the central portion. At the same time, the high frequency current I flows along the metal surface of the first resistor 105d from the end portion toward the central portion.

The distance from the metal surface of the base 105a to the end portion of the first resistor 105d is smaller than the skin depth of the high frequency power. The skin depth refers to a depth of the skin through which most of the high frequency current passes among the surface portions of a conductive material. Accordingly, if the gap between the base 105a and the first resistor 105d is smaller than the skin depth as in this embodiment, the high frequency current I may flow along the surface of the first resistor 105d. On the other hand, if the gap exceeds the skin depth, the high frequency current I may not flow along the surface of the first resistor 105d. And, the skin depth is defined as the following equation:

$$\delta = (2/\omega\sigma\mu)^{1/2}$$

where, $\omega = 2\pi f$ (f: frequency), $\sigma$: conductivity, $\mu$: permeability It is considered that since the first resistor 105d has a low resistance, the first resistor 105d is substantially equi-potential at both the central position PC and end position PE and the amount of current flowing along the metal surface of the first resistor 105d is approximately equal to the amount of current flowing along the metal surface of the base 105a. As a consequence, as viewed from the plasma side, it appears that the base 105a and the first resistor 105d are integrated to each other and the first dielectric material 105b is not existent. That is, because the first dielectric material 105b is shielded by the first resistor 105d, it is impossible to lower the high frequency electric field strength distribution E/Emax by the capacitance component of the first dielectric material 105b and thus the distribution becomes the electric field strength distribution E/Emax similar to the case where neither the first dielectric material 105b nor the first resistor 105d are present (FIG. 17A).

(2-4) In a Case that the Resistor has a Middle Resistance

Figure 4B:
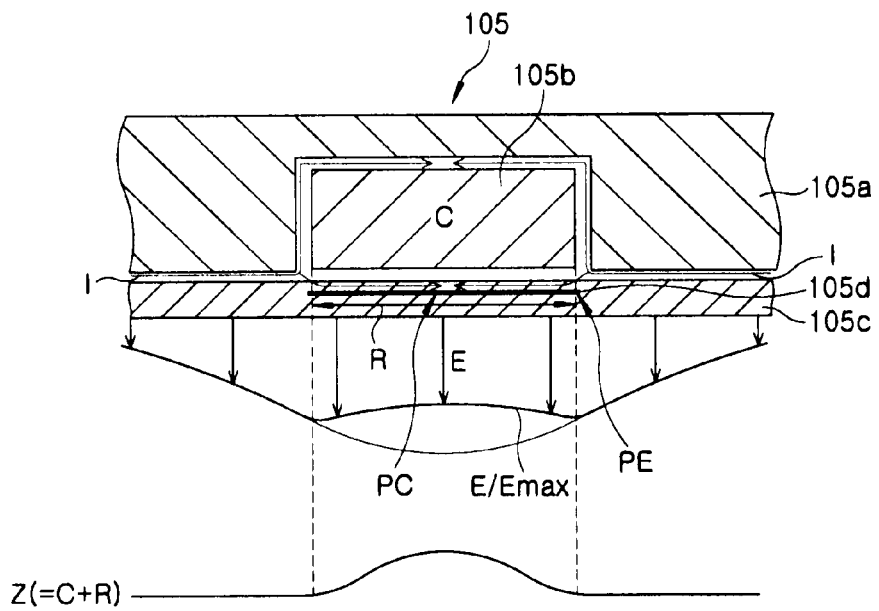
FIG. 4B is a view illustrating an electric field strength distribution in a case where there is provided a resistor with a middle resistance.

The simulation result in FIG. 3 showed a case where the first resistor 105d has a middle resistance (200Ω/☐) belonging to group B identical to the case where a tapered dielectric material is present (FIG. 17C). In this case, as shown in FIG. 4B, the high frequency current I flows along the metal surface of the base 105a of the upper electrode 105 from the end portion toward the central portion. At the same time, the high frequency current I flows along the metal surface of the first resistor 105d from the end portion toward the central portion.

Here, the first resistor 105d has a middle resistance. Accordingly, a potential difference occurs between the central position PC of the first resistor 105d and the end position PE of the first resistor 105d and a part of the high frequency energy is converted into Joule heat and consumed due to the resistance R of the first resistor 105d while the current flows through the first resistor 105d, and a potential distribution occurs corresponding to the current and resistor. Accordingly, in a case where the first resistor 105d has a middle resistance, the high frequency electric field strength distribution E/Emax may be gradually decreased.

That is, it is possible to make the impedance Z (=C+R) at the central portion of the upper electrode 105 gradually larger than the impedance Z (=C) at the end portion of the upper electrode 105 by providing the first resistor 105d. The larger the impedance is at the electrode side, the lower the electric field energy may be consumed by plasma. This allows the electric field strength distribution E/Emax to be uniform at both the central portion and the end portion of the upper electrode 105 as shown in FIG. 4B. Consequently, even without any tapered dielectric material, plasma with uniform electron density Ne may be generated by using the first dielectric material 105b and the first resistor 105d, similar to the case of using a tapered dielectric material.

Further, since it is not required to make the dielectric material 105b of the upper electrode 105 tapered in the embodiment, it is not necessary to raise mechanical processing accuracy, thus reducing costs, peeling of adhesive or sprayed material, as well as preventing contamination.

(2-5) In a Case that the Resistor has a High Resistance

Figure 4C:
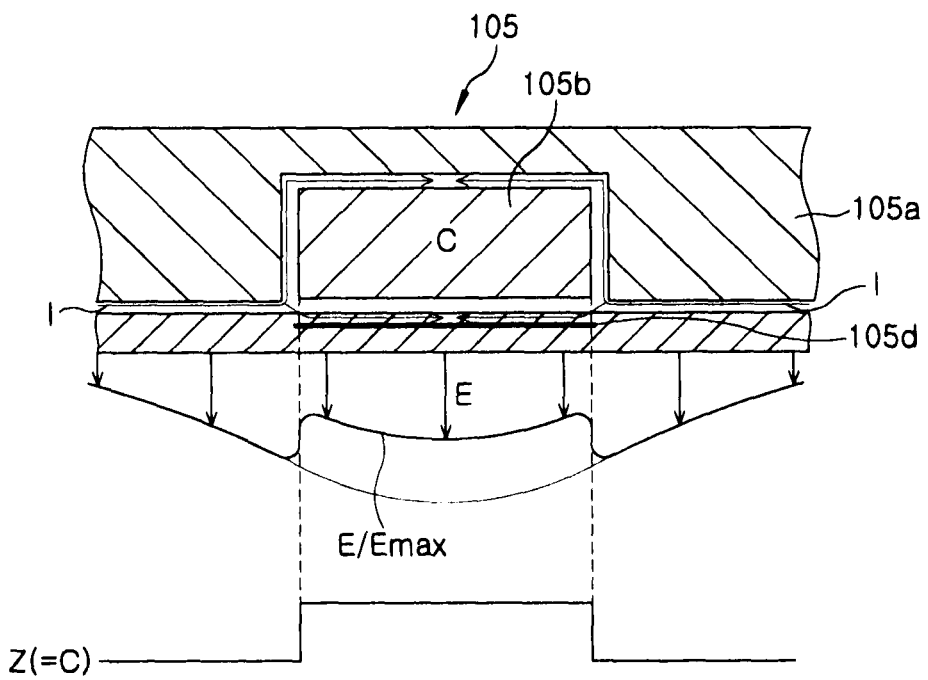
FIG. 4C is a view illustrating an electric field strength distribution in a case where there is provided a resistor with a high resistance.
Figure 17B:
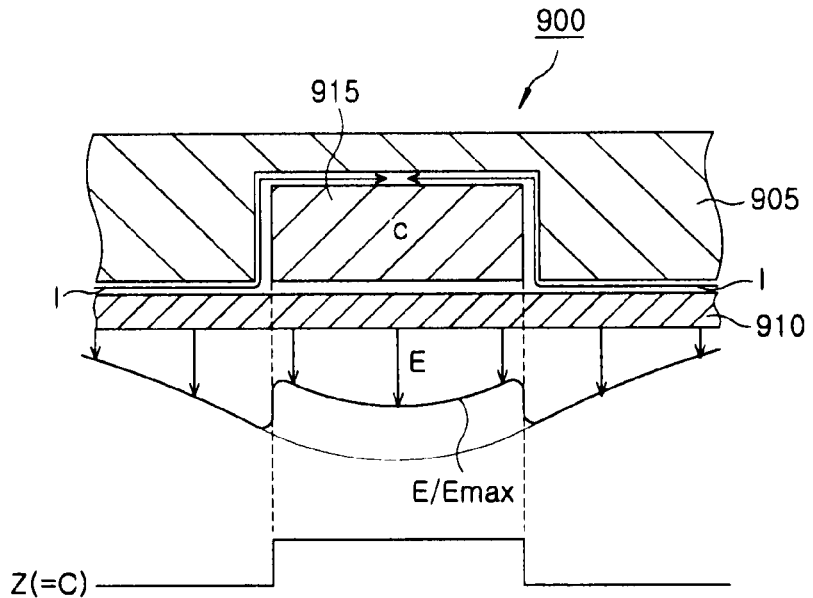
FIG. 17B is a view illustrating an electric field strength distribution where only a dielectric material is provided, without a resistor, according to the prior art.
Figure 17C:
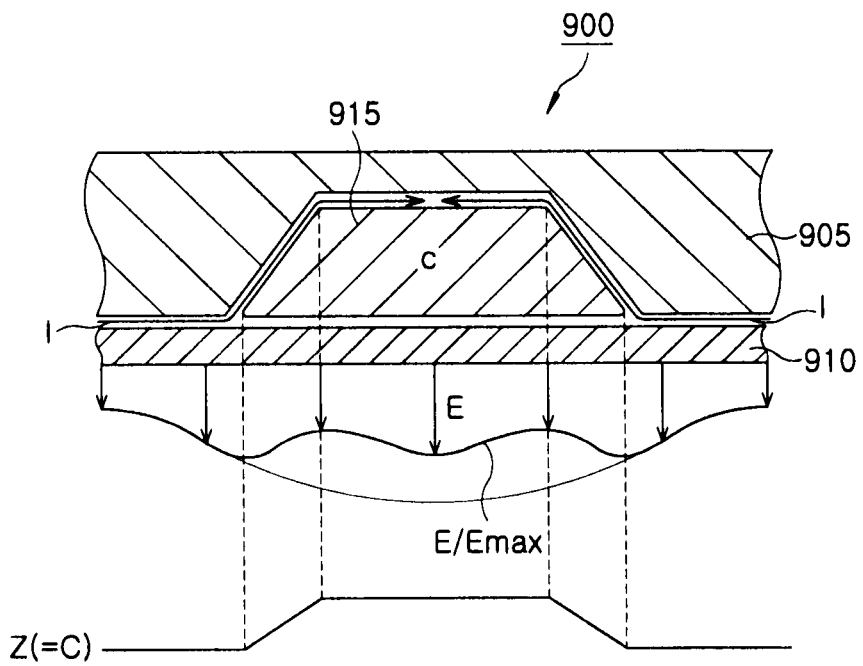
FIG. 17C is a view illustrating an electric field strength distribution where only a tapered dielectric material is provided, without a resistor, according to the prior art.

The simulation result in FIG. 3 showed a case where the first resistor 105d has a high resistance (20,000Ω/☐) belonged to group C, identical to the case where a dielectric material is only provided without any resistor (FIG. 17B). In this case, as shown in FIG. 4C, the high frequency current I flows along the metal surface of the base 105a of the upper electrode 105 from the end portion toward the central portion. Since the first resistor 105d has a high resistance, however, the first resistor 105d serves as an insulation material so the high frequency current I does not flow along the metal surface of the first resistor 105d. Resultantly, as viewed from the plasma side, it appears that the capacitance component C of the first dielectric material 105b is only existent and the electric field strength distribution E/Emax is lowered at the central portion and nonuniform at the end portion similarly to the case where only the dielectric material is provided as shown in FIG. 17B.

From the above results, the inventors came to a conclusion that the same effects form the tapered construction of the first dielectric material 105b can be obtained by setting the sheet resistance of the first resistor 105d to any one among 20Ω/☐~2000Ω/☐, which is higher than the low resistance of 2Ω/☐ and lower than the high resistance of 20000 Ω/☐.

(3) Relationship Between the Shape and a Combination of Resistors and an Electric Field Strength Distribution Next, the inventors performed simulations on how the shape or a combination of resistors affects the electric field strength distribution in order to optimize a proper shape or combination of the resistor.

(3-1) In a Case that the First Resistor (Patterned Resistor) is Provided

Figure 5A:
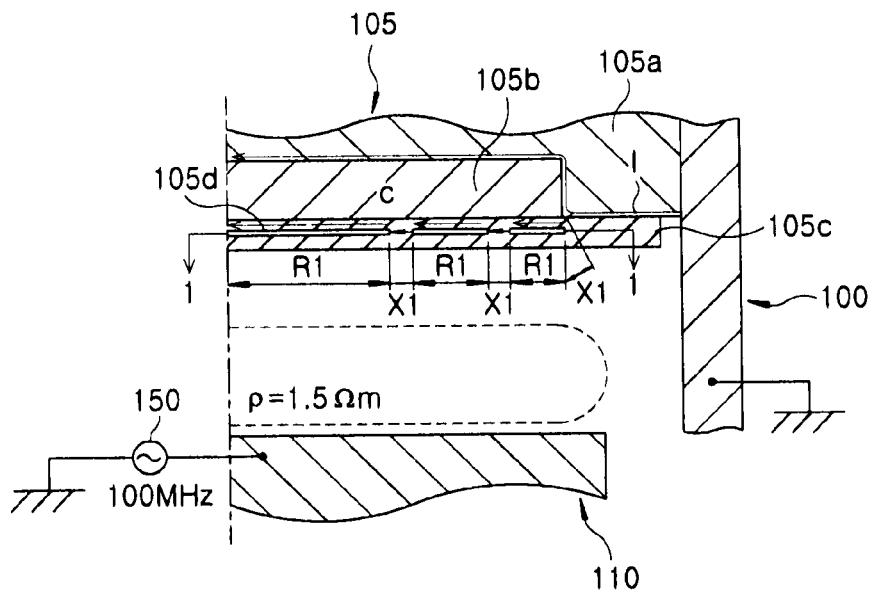
FIG. 5A is a view illustrating an electric field strength distribution in case of preparing for a patterned resistor.
Figure 6A:
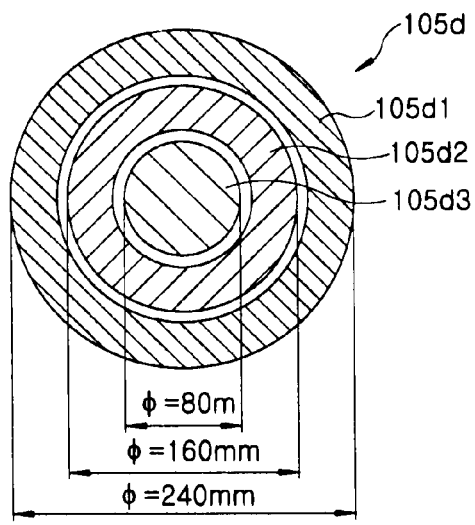
FIGS. 6A to 6C are views of an example of a patterned resistor.
Figure 6B:
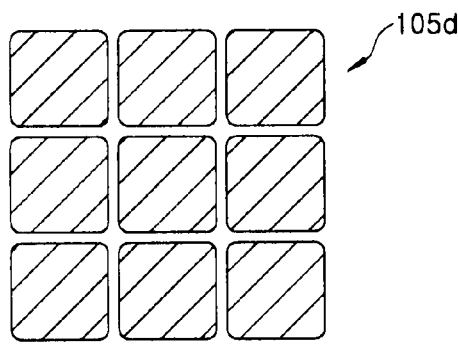

First, the inventors patterned the first resistor 105d as shown in FIG. 5A and FIG. 6A. The cross section taken along line 1-1 in FIG. 5A corresponds to a right half of FIG. 6A. The first resistor 105d is divided into three ring shaped members. The outermost ring shaped member 105d1 has a diameter Ø of 240 mm, the middle ring shaped member 105d2 a diameter Ø of 160 mm, and the innermost ring shaped member 105d3 a diameter Ø of 80 mm. The members are equi-spaced by a predetermined distance from each other. The predetermined equal distance is set so that its impedance 1/Cω is larger than resistance R of the first resistor 105d.

Figure 5B:
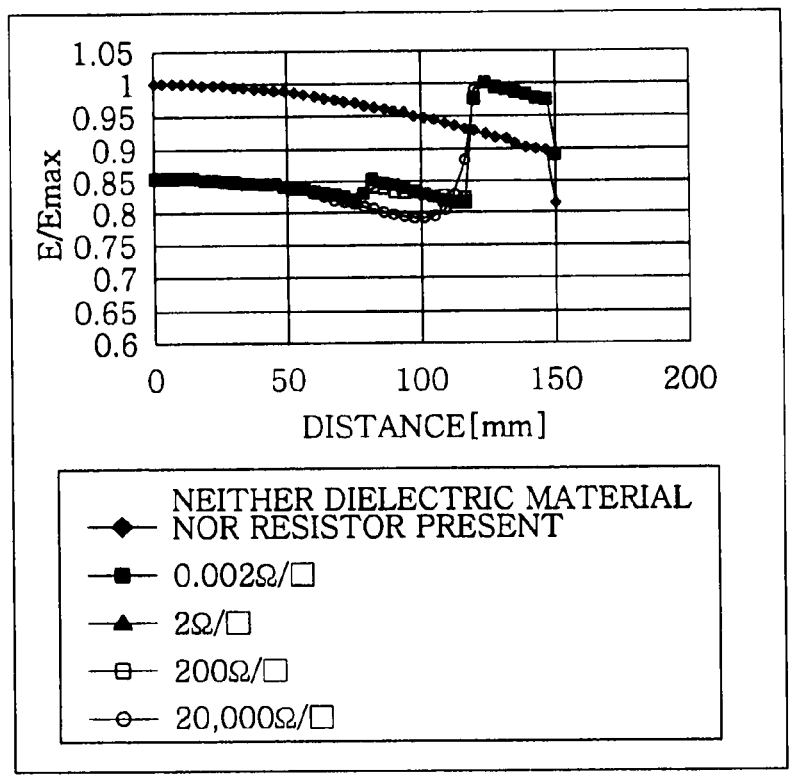
FIG. 5B is a graph illustrating an electric field strength distribution in case of preparing for a patterned resistor.

The simulation result in FIG. 5B showed that an electric field strength distribution when the first resistor 105d has a low resistance (0.002Ω/☐, 2Ω/☐) or a middle resistance (200Ω/☐), similar to that when the dielectric material 915 has such steps as shown in FIG. 16D. As viewed from the plasma side, there appear the capacitance component C of the first dielectric material 105b, the resistance component R1 of the first resistor 105d, and the reactance component X1 occurring between metals in the insulation layer 105c, whereby the electric field strength distribution E/Emax at the central portion of the upper electrode 105 is lowered, thus making the overall distribution uniform as shown in FIG. 5B and generating a uniform plasma. In a case where the first resistor 105d has a high resistance (20,000Ω/☐), more nonuniformity in electric field strength distribution E/Emax occurred near the end portion of the first dielectric material 105b than in a case where the first resistor 105d has a low or middle resistance. Accordingly, especially when there is a limit to the thickness of the first dielectric material 105b, the state of the electric field strength distribution E/Emax may be corrected by patterning the first resistor 105d.

Figure 6C:
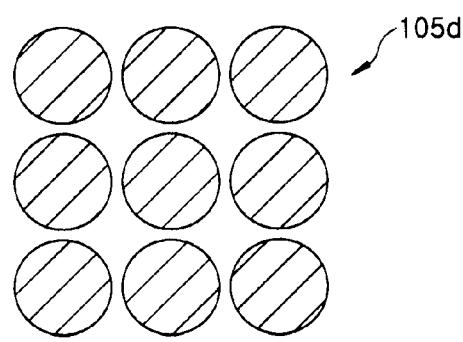

Further, instead of being formed as the plurality of ring-shaped members spaced from each other by the predetermined distance as shown in FIG. 6A, the first resistor 105d may be formed as a plurality of island-shaped members each being substantially shaped as a square and spaced from the others by a predetermined distance as shown in FIG. 63, or as a plurality of island-shaped members each being shaped as a circle and spaced from the others by a predetermined distance as shown in FIG. 6C. In either case, the predetermined distance is set so that its impedance 1/CΩ is greater than the resistance R of the first resistor 105d.

Figure 7A:
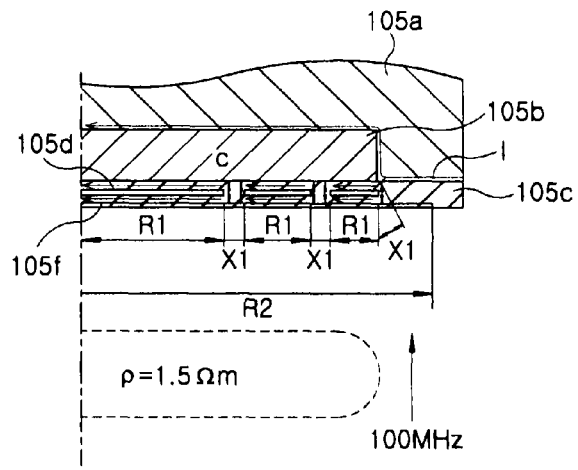
FIG. 7A is a view illustrating an electric field strength distribution in a case where there are provided a first resistor (patterned resistor) and a second resistor (integrated resistor)

(3-2) In a case that the First Resistor and the Second Resistor (Integrated Resistor) are Provided In addition to the first resistor 105d separated in three ring-shaped members, the inventors provided an integrated (sheet type) second resistor 105f between the first dielectric material 105b and plasma as shown in FIG. 7A. Although it has been illustrated in FIG. 7A that the second resistor 105f is buried in the insulation layer 105c under the first resistor 105d, the second resistor 105f may be buried in the insulation layer 105c over the first resistor 105d. The second resistor 105f may also be provided in tight contact with the plasma-side surface of the insulation layer 105c while being exposed from the insulation layer 105c.

In a case where the second resistor 105f has a low resistance (0.01 Ωm), as shown in FIG. 7A, there appear the capacitance component C of the first dielectric material 105b, the resistance component R1 of the first resistor 105d, the reactance component X1 by the gap of the first resistor 105d, and the resistance component R2 of the second resistor 105f, as viewed from the plasma side. As shown in the upper graph in FIG. 7B, it may be possible to gradually lower the electric field strength distribution E/Emax at the central portion of the upper electrode 105. Particularly, in a case where there is a limit to the thickness of the first dielectric material 105b or the like, the state of the electric field strength distribution E/Emax may be amended by the second resistor 105f.

Figure 7B:
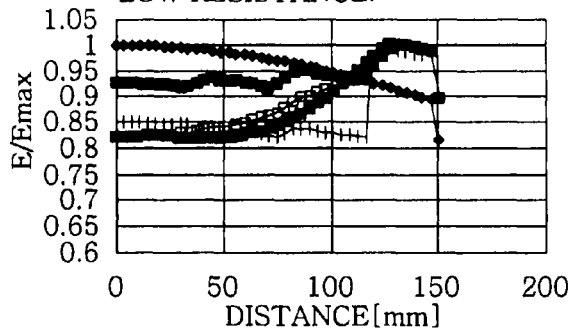
FIG. 7B is graphs illustrating an electric field strength distribution in a case where there are provided a first resistor (patterned resistor) and a second resistor (integrated resistor)
Figure 7B:
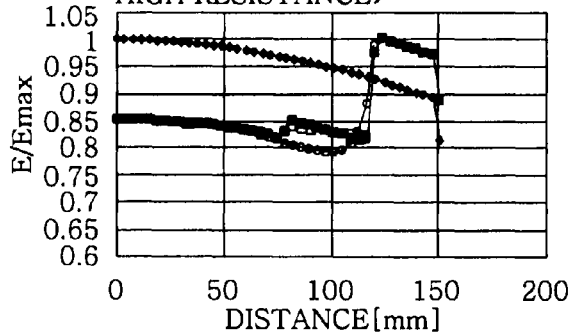

As shown in the lower graph in FIG. 7B, even in a case where the second resistor 105f has a high resistance (1 Ωm), it may be possible to make the entire distribution uniform by lowering the electric field strength distribution E/Emax at the central portion of the upper electrode 105. If the second resistor 105f is high in resistance, the resistance component R2 is high and accordingly, the second resistor 105f may be considered as an insulation material as viewed from the plasma side as compared to a case where the second resistor 105f is low in resistance. Further, the second resistor 105f may be constituted by a plurality of combinations of low resistances and high resistances.

In providing the integrated second resistor 105f between the first dielectric material 105b and plasma in addition to the first resistor 105d, the total sheet resistance of the first resistor 105d and the second resistor 105f may be set to be greater than the low resistance (2Ω/☐) and smaller than the high resistance (20000Ω/☐), e.g., preferably somewhere between 20Ω/☐ and 2000Ω/☐.

Figure 8A:
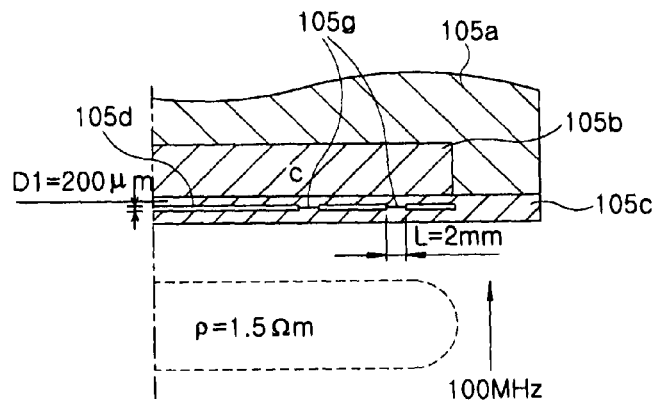
FIG. 8A is a view illustrating an electric field strength distribution in a case where there are provided a first resistor and a third resistor (joint resistor)

(3-3) In a Case that the First Resistor and a Third Resistor (Joint Resistor) are Provided (3-3-1) Electric Field Strength Distribution Depending on Changes in a Frequency A variation with a frequency in electric field strength distribution E/Emax will now be described in using an electrode obtained by combining a first resistor and a third resistor (joint resistor). As shown in FIG. 8A, the inventors further provided a third resistor 105g at each gap between the three separated members of the dielectric material 105b, in addition to the three separated ring-shaped members of the first resistor 105d. In another word, the third resistor 105g is provided at each joint between the three separated ring-shaped members of the first resistor 105d to connect therebetween.

Figure 8B:
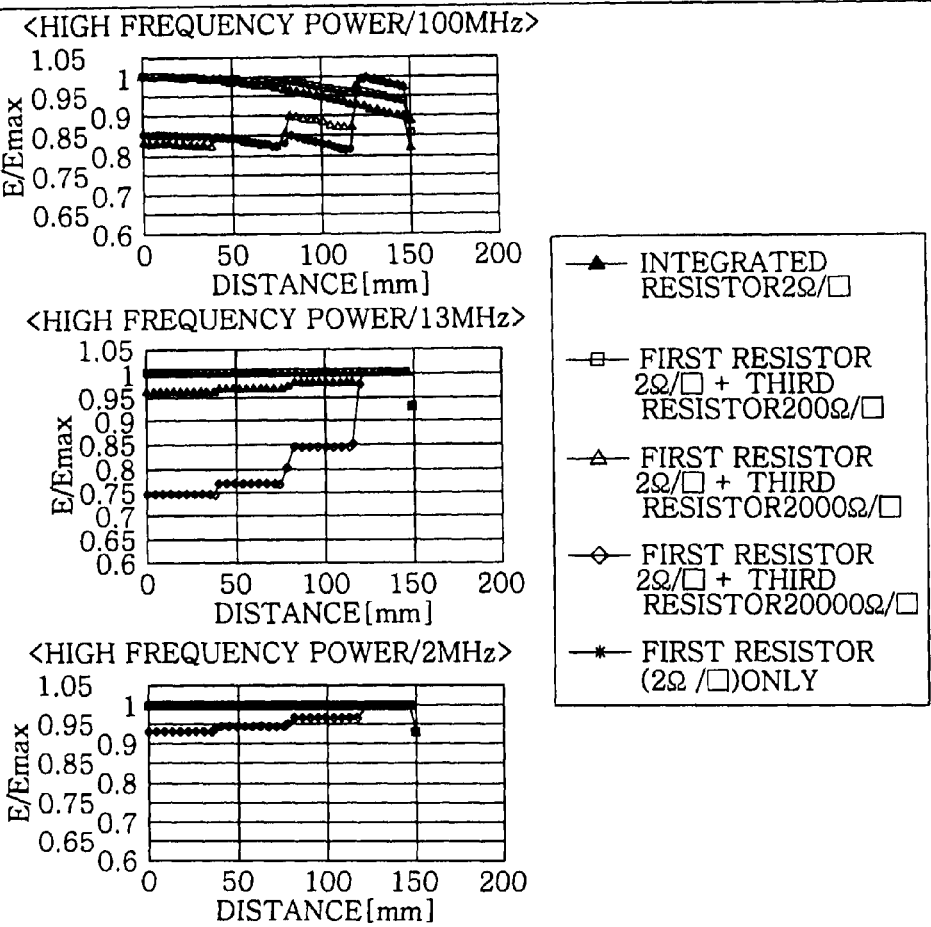
FIG. 8B is graphs illustrating an electric field strength distribution in a case where there are provided a first resistor and a third resistor (joint resistor)

As conditions, the first resistor 105d was formed to have separated ring-shaped or circular members, with a width D1 of 200 μm and diameters Ø of 160 mm, 240 mm and 80 mm, and a resistance of 2Ω/☐. And, the third resistor 105g was set to have resistances of 200Ω/☐, 2000Ω/☐, and 20000Ω/☐. A simulation was made on each case and its results were shown in FIG. 8B. In FIG. 8B, there is shown a respective case where the frequency of high frequency power supplied from the first high frequency power source 150 for plasma excitation is 100 MHz, 13 MHz, and 2 MHz.

Referring to FIG. 8B, as the frequency increases from 2 MHz through 13 MHz to 100 MHz, the electric field strength distribution E/Emax tends to be lowered at the central portion of the upper electrode 105. This tendency is not changed even though the resistance of the third resistor 105g varies from 200Ω/☐ through 2000Ω/☐ to 20000Ω/☐. Specifically, while the capacitance is represented as $1/j\omega C$ and depends on the frequency ($\omega = 2\pi f$), the resistance R is not frequency dependent. Accordingly, the impedance Z, due to the capacitance component C of the first dielectric material 105b, is reduced as the frequency is increased. On the other hand, the resistance R is constant regardless of the frequency. Thus, as the frequency is increased, the entire impedance Z in frequency characteristic is decreased and a high frequency current is prone to flow through the first resistor 105d and the third resistor 105g. According to the result in FIG. 8B, as the third resistor 105g is higher in resistance, the electric field strength is lowered due to the capacitance C and the resistance R and the electric field strength distribution E/Emax is lowered at the central portion of the upper electrode 105. Further, as the frequency becomes higher, a high frequency current flows through the first and third resistors, which leads to lowering in electric field strength, and although the resistance of the third resistor 105g is lowered, the electric field strength distribution E/Emax is lowered at the central portion of the upper electrode 105, thus capable of making the distribution uniform over the bottom portion of the electrode.

(3-3-2) Electric Field Strength Distribution of Resistors with a Difference in Thickness (First and Third Resistors)

Figure 9A:
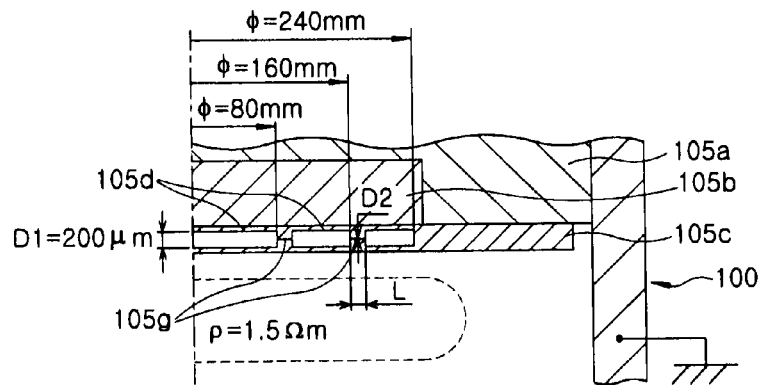
FIG. 9A is a view illustrating an electric field strength distribution in a case where the thickness of the third resistor is varied while the first resistor is $0.5\Omega/\square$ and its frequency is 100 MHz.

Next, as shown in FIG. 9A, the inventors performed simulation based on changes in width L (gap) between the three ring-shaped members of the first resistor 105d as well as changes in thickness D2 of the third resistor 105g. As conditions for this simulation, the first resistor 105d was set to have ring-shaped members with a width D1 of 200 μm and diameters Ø of 160 mm, 240 mm, and a circular shaped member with a width D1 of 200 μm and a diameter Ø of 80 mm, and a resistance of 0.5Ω/☐. The frequency of the high frequency power was 100 MHz. A thickness of the third resistor 105g was set to vary from 0.1 mm through 0.05 mm to 0.01 mm.

Figure 9B:
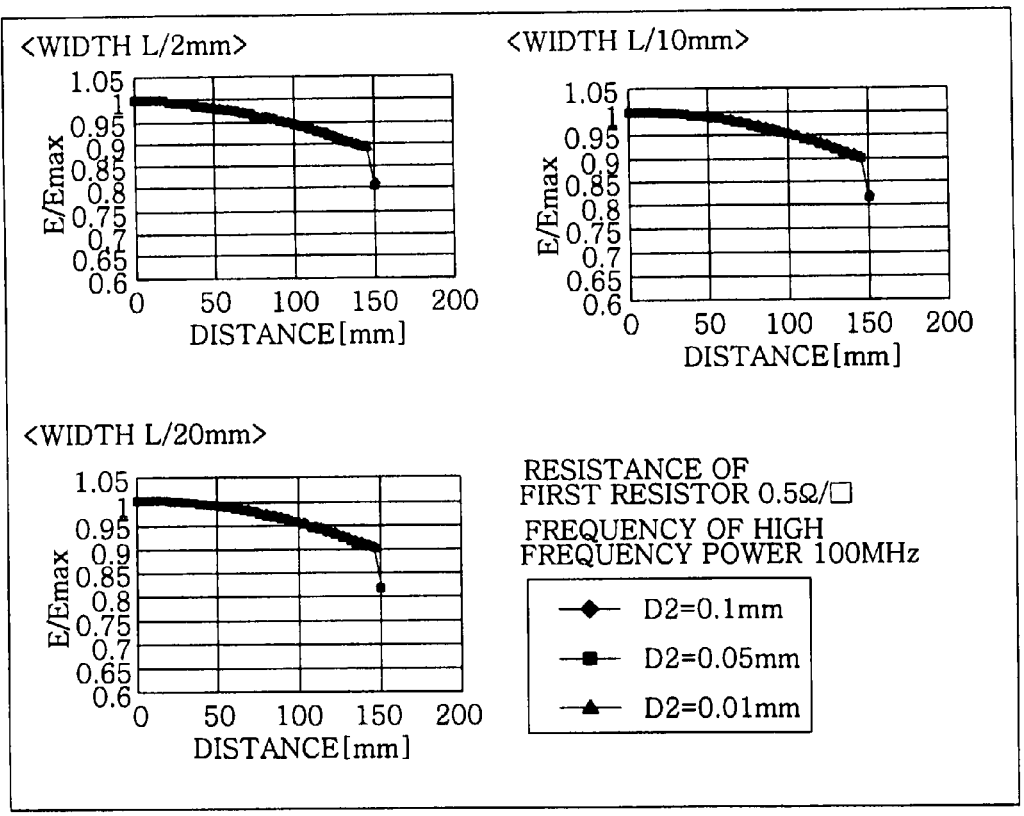
FIG. 9B is graphs illustrating an electric field strength distribution in a case where the thickness of the third resistor is varied while the first resistor is $0.5\Omega/\square$ and its frequency is 100 MHz.

A result was shown in FIG. 9B. From top to bottom, each of the graphs in FIG. 9B depicts where the width L of the first resistor 105d is 2 mm, 10 mm, and 20 mm, respectively. They show that in any case, there was no lowering in electric field strength distribution E/Emax at the central portion of the upper electrode 105 and it was impossible to make the electric field strength distribution E/Emax uniform at the bottom portion of the electrode.

The inventors changed only the resistance of the first resistor 105d to 5Ω/☐ under the same construction as introduced for the simulation in FIG. 9A. The frequency of the high frequency power was set to 100 MHz and the thickness D2 of the third resistor 105g was set to 0.1 mm, 0.05 mm, and 0.01 mm.

Figure 10:
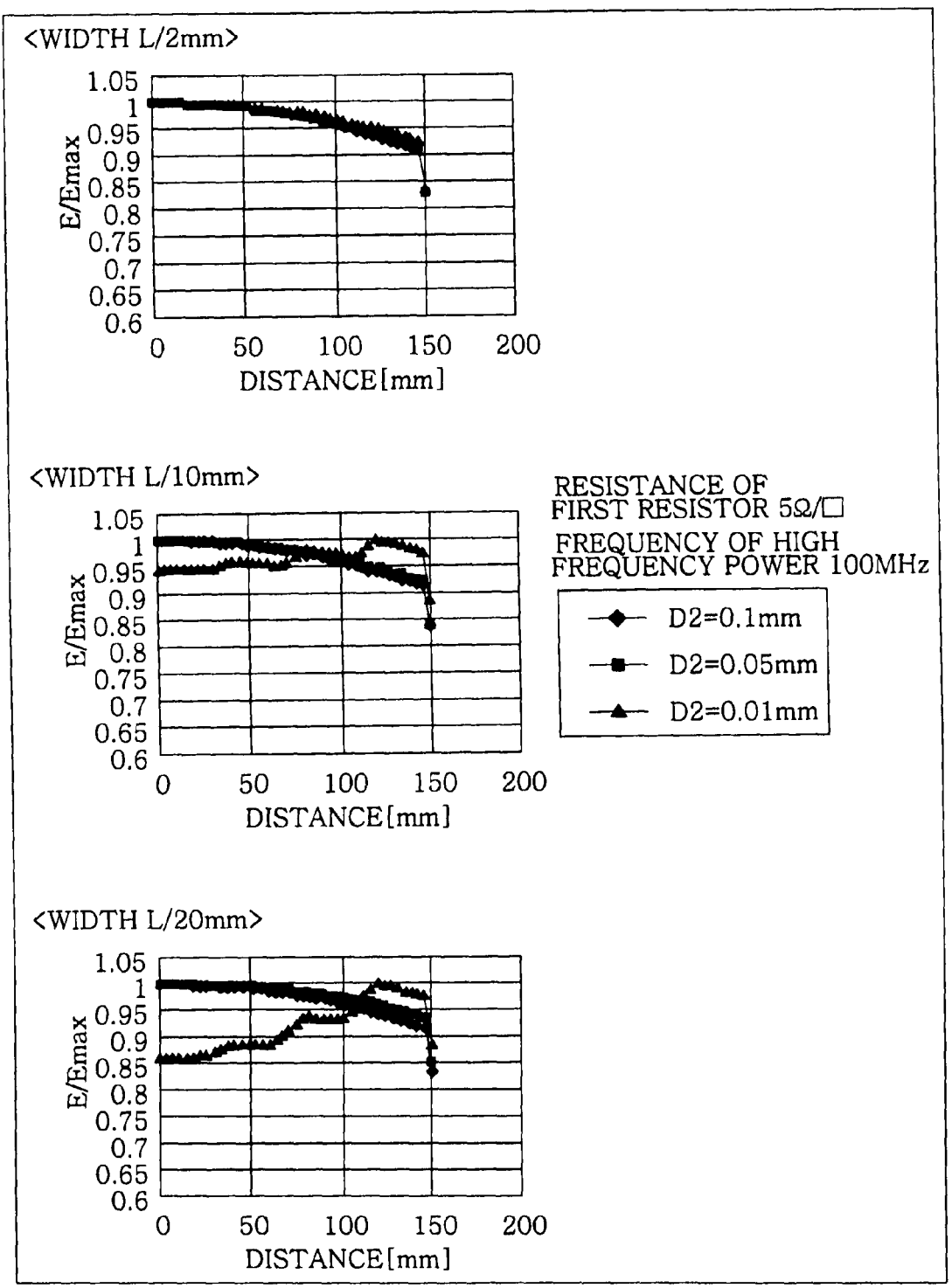
FIG. 10 is graphs illustrating an electric field strength distribution in a case where the thickness of the third resistor is varied while the first resistor is $5\Omega/\square$ and its frequency is 100 MHz.

A result of the above simulation is depicted in FIG. 10. FIG. 10 shows that in a case where the width L is 2 mm, the electric field strength distribution E/Emax was not lowered at the central portion of the upper electrode 105. On the other hand, when the width L is 10 mm and 20 mm, the electric field strength distribution E/Emax was lowered at the central portion of the upper electrode 105 as the third resistor 105g has thinner thickness.

Further, the inventors changed only the resistance of the first resistor 105d to an even higher resistance of 50Ω/☐ under the same configuration. The frequency of the high frequency power was set to 100 MHz and the thickness D2 of the third resistor 105g was set to 0.1 mm, 0.05 mm, and 0.01 mm.

Figure 11:
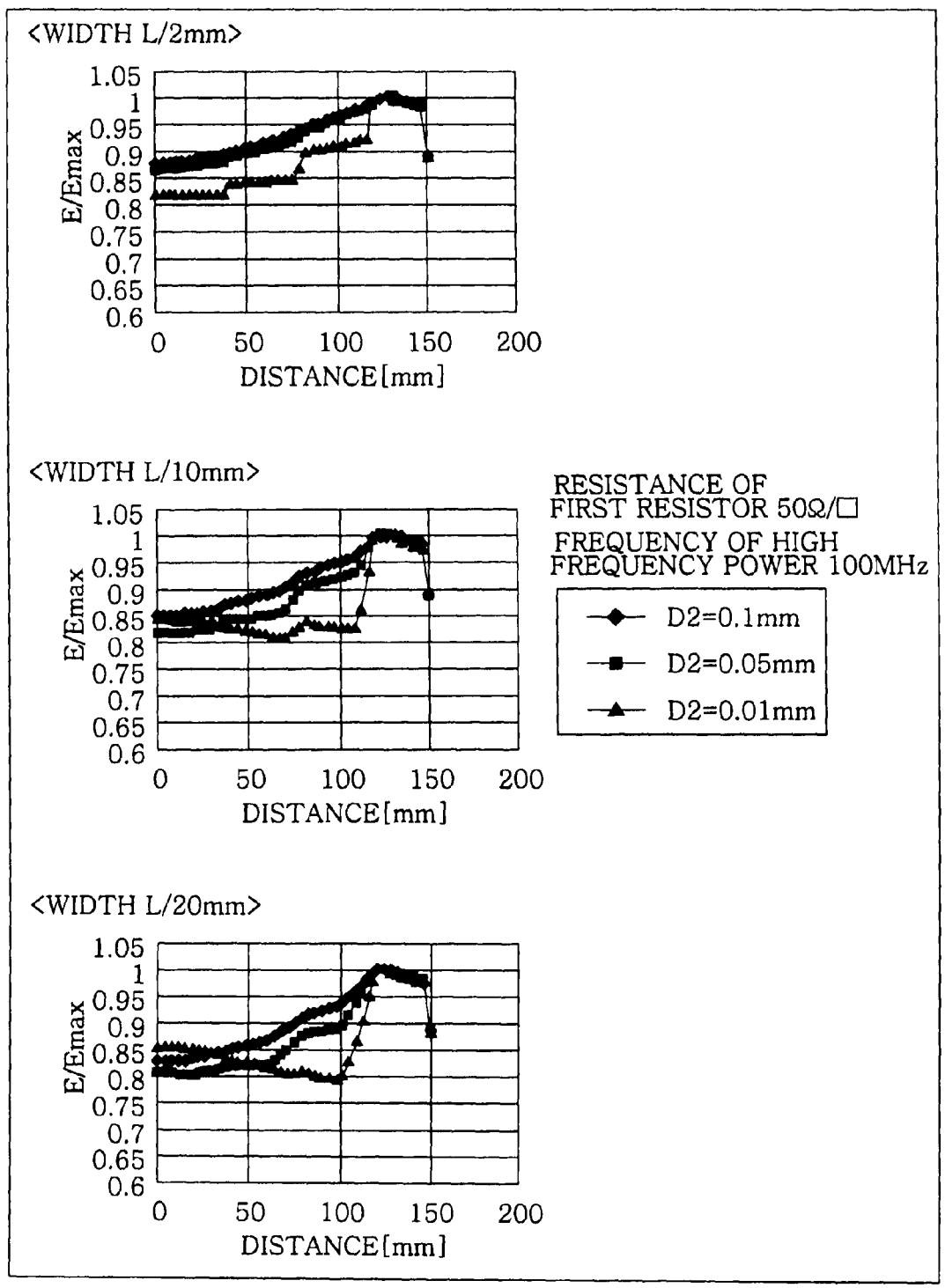
FIG. 11 is graphs illustrating an electric field strength distribution in a case where the thickness of the third resistor is varied while the first resistor is $50\Omega/\square$ and its frequency is 100 MHz.

A result of the above simulation is depicted in FIG. 11. FIG. 11 shows that in any case where the width L is 2 mm, 10 mm, and 20 mm, the electric field strength distribution E/Emax was lowered at the central portion of the upper electrode 105. As the third resistor 105g had thinner thicknesses, this tendency became noticeable.

Next, the inventors changed the resistance of the first resistor 105d to 5Ω/☐ and the frequency of the high frequency power to 13 MHz, and set the thickness D2 of the third resistor 105g to 0.1 mm, 0.05 mm, and 0.01 mm, under the same construction.

Figure 12:
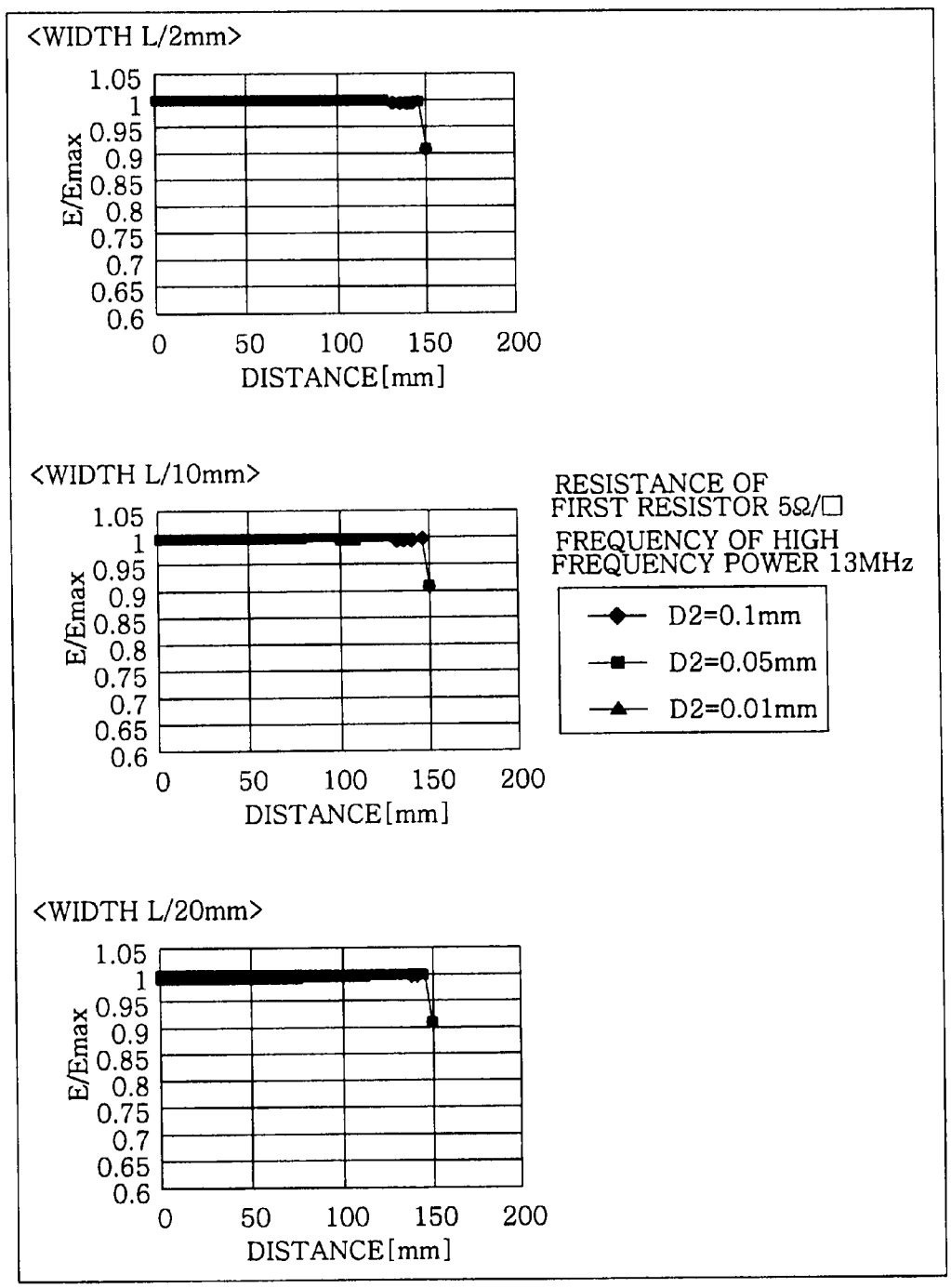
FIG. 12 is graphs illustrating an electric field strength distribution in a case where the thickness of the third resistor is varied while the first resistor is $5\Omega/\square$ and its frequency is 13 MHz.

A result of the above simulation is depicted in FIG. 12. This shows that in any case where the width L is 2 mm, 10 mm, and 20 mm, the electric field strength distribution E/Emax was not lowered at the central portion of the upper electrode 105 and the electric field strength distribution E/Emax was not uniform at the bottom portion of the electrode.

Thus, the inventors changed the resistance of the first resistor 105d to an even higher resistance, i.e., 50Ω/☐ and set the frequency of the high frequency power to 13 MHz, and the thickness of the third resistor 105g to 0.1 mm, 0.05 mm, and 0.01 mm, under the above configuration.

Figure 13:
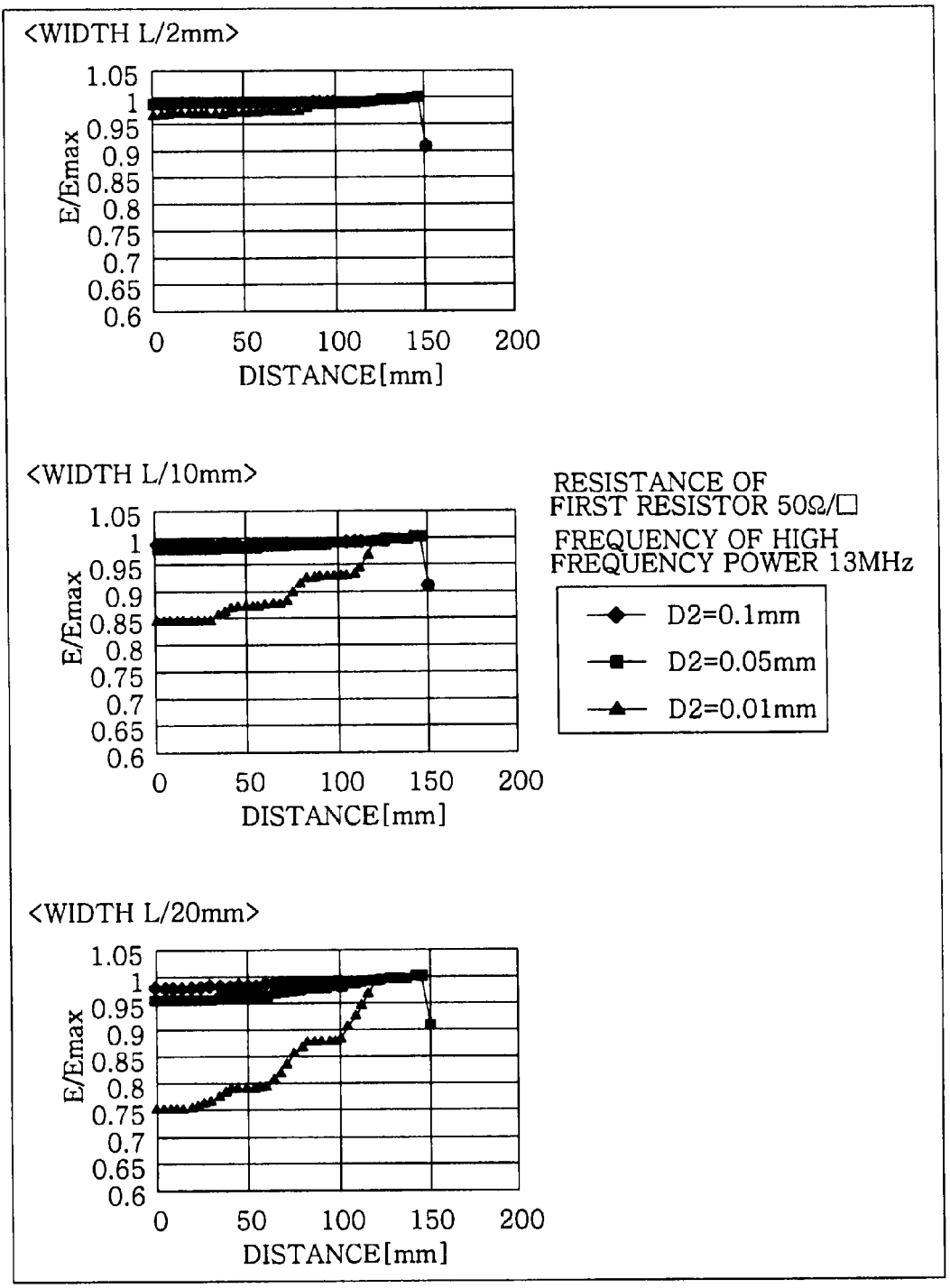
FIG. 13 is graphs illustrating an electric field strength distribution in a case where the thickness of the third resistor is varied while the first resistor is $50\Omega/\square$ and its frequency is 13 MHz.

A result of the above simulation is shown in FIG. 13. FIG. 13 shows that as the width L increases, the electric field strength distribution E/Emax is lowered at the central portion of the upper electrode 105 and the electric field strength distribution E/Emax was uniform at the bottom portion of the electrode.

From the above results, in a case where the high frequency power whose frequency ranges from 13 MHz to 100 MHz is applied to the apparatus, while the sheet resistance of the first resistor 105d is simultaneously set in the range from 5Ω/☐ to 50Ω/☐, the predetermined distance between the ring-shaped members of the first resistor 105d may be within a range of 10 mm to 20 mm.

(3-4) In a Case that the First Resistor has an Opening at its Central Portion

Figure 14A:
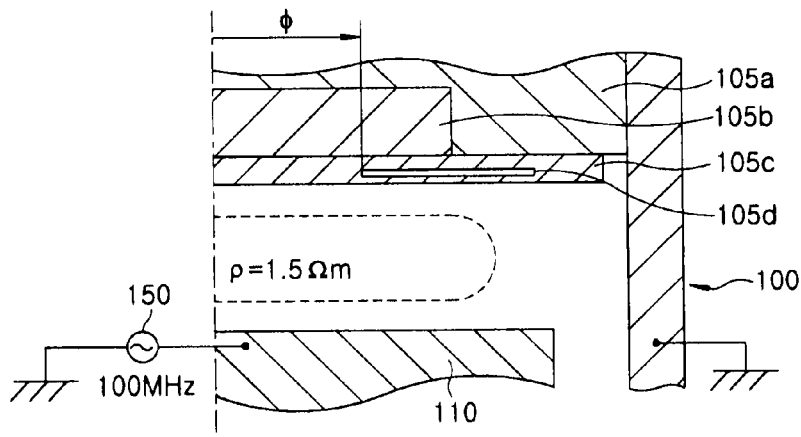
FIG. 14A is a view illustrating an electric field strength distribution where the first resistor has an opening at its central portion.
Figure 14B:
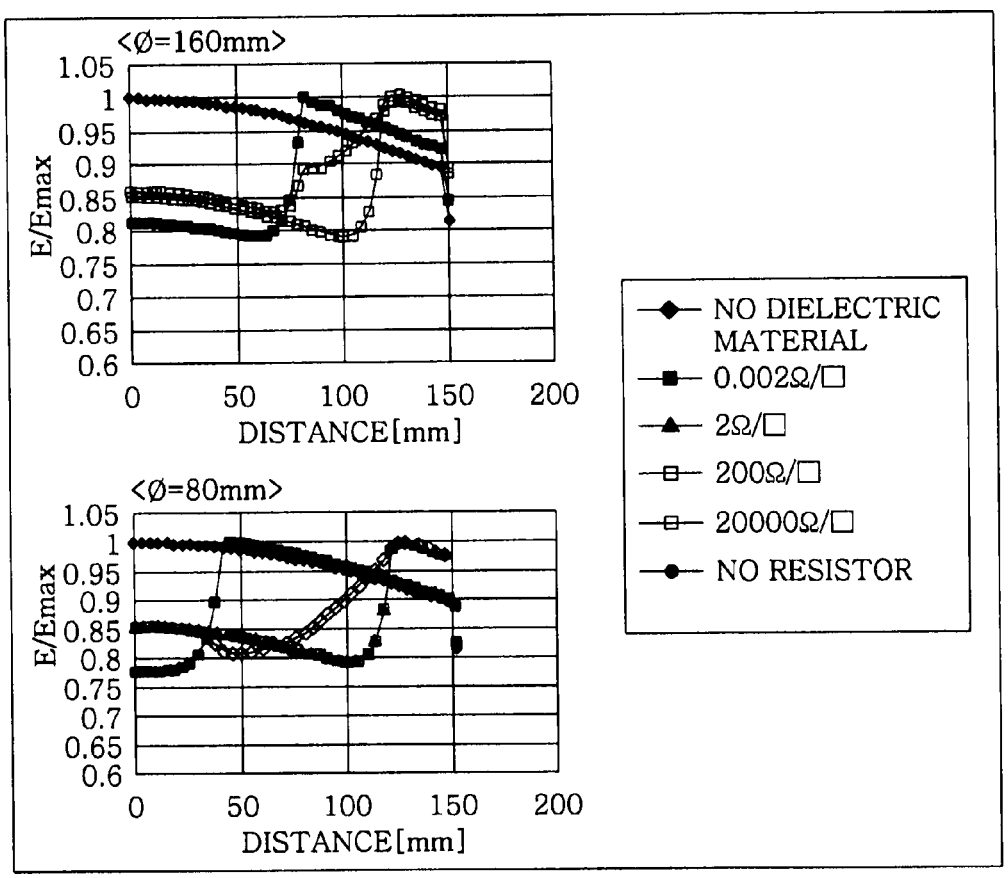
FIG. 14B is graphs illustrating an electric field strength distribution where the first resistor has an opening at its central portion.

Next, the inventors performed simulation on a case where the first resistor 105d is a single ring-shaped member with an opening at its central portion as shown in FIG. 14A. As conditions for this simulation, the diameter Ø of the opening at the central portion of the first resistor 105d was set to 160 mm and its resistance was set to 0.002Ω/☐, 2Ω/☐, 200Ω/☐, and 20,000Ω/☐. Further, the frequency of the high frequency power was set to 100 MHz. A result of the simulation is depicted in FIG. 14B. FIG. 14B shows that the electric field strength distribution E/Emax was lowered at the upper electrode near the opening, depending on the diameter of the opening of the first resister 105*d*.

The inventors performed a simulation on a case where the diameter Ø of the central opening of the first resistor 105*d* was changed to 80 mm. The result also showed that the electric field strength distribution E/Emax was lowered at the upper electrode 105 near the opening, depending on the diameter of the opening of the first resistor 105*d*. It could be seen from the result shown in FIG. 14B that the same effects as the case where the first dielectric material 105*b* is provided with steps or tapered portions may be achieved by adjusting the diameter of the opening included in the metal resistor (the first resistor 105*d*).

(4) A Relationship Between the Shape of a Dielectric Field, Resistor, and Electric Field Strength Distribution Finally, in a case where an angle of the tapered portion of the first dielectric material 105*b* is changed, the inventors performed a simulation to see whether there is an effect on lowering electric field distribution E/Emax, depending on the availability of an integrated first resistor 105*d*.

Figure 15A:
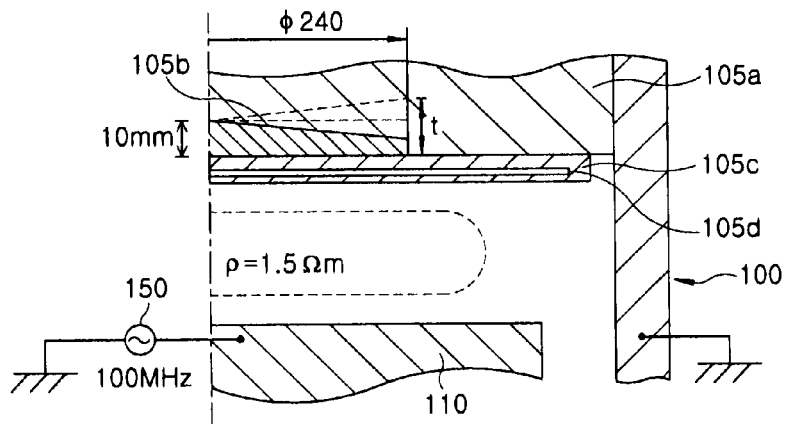
FIG. 15A is a view illustrating an electric field strength distribution depending on an availability of the first resistor and changes in the shape of the dielectric material.

As conditions for this simulation, the first dielectric material 105*b* used had a dielectric constant ∈ of 10, a diameter Ø of 240 mm and a height of 10 mm at its central portion, as shown in FIG. 15A. Further, the height t at the end portion of the first dielectric material 105*b* varied from 1 mm to 15 mm through 5 mm and 10 mm. And, the frequency of the high frequency power was set to 100 MHz. The gap between the upper and lower electrodes was 5 mm.

Figure 15B:
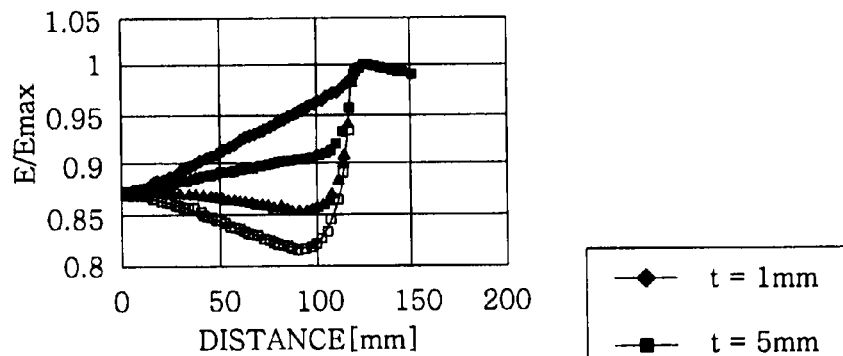
FIG. 15B is graphs illustrating an electric field strength distribution depending on an availability of the first resistor and changes in the shape of the dielectric material.
Figure 15B:
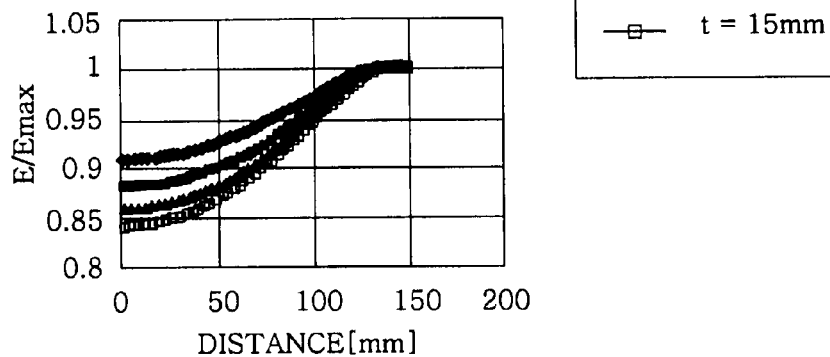

A result of the simulation is depicted in FIG. 15B. The upper graph of FIG. 15B refers to a case where there is no first resistor 105*d* and the lower graph refers to a case where there is a first resistor 105*d*. In either case, as the height t increased, the capacitance component C at the end portion of the first dielectric material 105*b* increased correspondingly and thus there was a great lowering in electric field strength distribution E/Emax. In the case where the first resistor 105*d* is present, when compared to the case where there is no first resistor 105*d*, however, the electric field strength distribution E/Emax of the upper electrode 105 was smoothly varied. As a consequence, it could be seen that if the first resistor 105*d* is placed between the first dielectric material 105*b* and the plasma, it may be possible to obtain a uniform electric field strength distribution without relying only on the shape of the first dielectric material 105*b*.

In the electrode according to the above embodiment, as described above, the sheath electric field generated on the plasma-side surface of the upper electrode 105 may be affected by the capacitance of the first dielectric material 105*b* and the resistance of a singularity or plurality of resistors. Thus, the electric field strength distribution E/Emax for generating plasma can be lowered.

While the preferred embodiments of the present invention have been described with reference to the accompanying drawings, the present invention is not limited thereto. It will be understood by those skilled in the art that various changes and modifications may be made without departing from the scope of the invention as defined in the following claims.

For example, the first resistor for the electrode according to the present invention may be a patterned metal provided between the first dielectric material and the plasma. For example, the first resistor may be exposed at the plasma side but not buried in the insulation layer.

Further, the electrode according to the present invention may be applied to the lower electrode or both the upper electrode and the lower electrode without being limited to the upper electrode. In this case, the second resistor as described above may also serve as an electrostatic chuck that electrostatically adsorbs the wafer W mounted on the lower electrode by applying a DC voltage to the electrode.

In a case where the first resistor is patterned, there may be provided at the gap a plurality of gas holes that pass through the electrode.

The target object may be a silicon wafer whose size is not less than 200 mm or 300 mm, or 730 mm×920 mm or more.

What is claimed is:

1. A plasma processing apparatus comprising: a processing chamber that plasma processes a target object therein, an upper electrode and a lower electrode that are provided in the processing chamber to face each other and have a processing space therebetween, and a high frequency power source that is connected to at least one of the upper electrode or the lower electrode to supply a high frequency power to the processing chamber,
    wherein the upper electrode includes:
    a base formed of a metal;
    a plate-shaped dielectric material provided at a central portion of a plasma-side of the base, the plate-shaped dielectric material being shaped as a plate without having a tapered edge; and
    a resistor provided between the plate-shaped dielectric material and the processing space and configured to make an impedance at a central portion of the upper electrode gradually larger than that at a peripheral portion of the upper electrode, the resistor being formed of a metal with a predetermined pattern and the resistor is not in contact with the plate shaped dielectric material;
    wherein the plate-shaped dielectric material is provided only at a central portion of the plasma-side of the base and the resistor is disposed substantially only within a region directly beneath the plate-shaped dielectric material.

2. The plasma processing apparatus of claim 1, wherein the resistor is buried in a dielectric layer that is brought in tight contact with a plasma-side surface of the plate-shaped dielectric material.

3. The plasma processing apparatus of claim 1, wherein a sheet resistance of the resistor ranges from 20Ω/☐ to 2000Ω/☐.

4. The plasma processing apparatus of claim 1, wherein the resistor has a plurality of ring-shaped members or island shaped members spaced apart from each other.

5. The plasma processing apparatus of claim 4, wherein the members of the resistor are spaced apart from each other by a predetermined distance, which is set so that an impedance 1/Cω of the predetermined distance is greater than a resistance R of the resistor.

6. The plasma processing apparatus of claim 4, wherein a resistor element thinner in thickness than the ring-shaped members or island-shaped members is provided between the ring-shaped members or island-shaped members.

7. The plasma processing apparatus of claim 6, further comprising a further resistor member formed of a metal provided between the plate-shaped dielectric material and the processing space.

8. The plasma processing apparatus of claim 4, further comprising gas feeding holes provided between the members of the resistor.

9. The plasma processing apparatus of claim 1, further comprising a further resistor member formed of a metal provided between the plate-shaped dielectric material and the processing space.

10. The plasma processing apparatus of claim 9, wherein a total sheet resistance of the resistor and the further resistor member ranges from 20ω/□ to 2000Ω/□.

11. The plasma processing apparatus of claim 1, wherein a frequency of the high frequency power ranges from 13 MHz to 100 MHz.

12. The plasma processing apparatus of claim 1, wherein the resistor is formed in tight contact with a plasma-side surface of a dielectric layer that is brought in tight contact with a plasma-side surface of the plate-shaped dielectric material.

13. The plasma processing apparatus of claim 1, wherein the resistor is not connected to any power supply.

14. An electrode for use in a plasma processing apparatus that applies high frequency power to the electrode to generate plasma of a gas and performs a plasma processing on a target object by using the generated plasma,
wherein the electrode is at least one of a first electrode or a second electrode that face each other and have a plasma processing space therebetween, and the electrode comprises:
a base formed of a metal;
a plate-shaped dielectric material provided at a central portion of a plasma-side of the base, the plate-shaped dielectric material being shaped as a plate without having a tapered edge; and
a resistor provided between the plate-shaped dielectric material and the processing space plasma without being connected to a power supply and configured to make an impedance at a central portion of the electrode gradually larger than that at a peripheral portion of the electrode, the resistor being formed of a metal with a predetermined pattern and the resistor is not in contact with the plate shaped dielectric material;
wherein the electrode is an upper electrode or a lower electrode, wherein the plate-shaped dielectric material is provided only at a central portion of the plasma-side of the base, and wherein where the electrode is an upper electrode the resistor is disposed substantially only within a region directly beneath the plate-shaped dielectric material, and wherein where the electrode is a lower electrode the resistor is disposed substantially only within a region directly above the plate-shaped dielectric material.

15. The electrode of claim 14, further comprising an integrated resistor member provided between the plate-shaped dielectric material and the processing space.

16. The electrode of claim 15, wherein the electrode is a lower electrode and the integrated resistor member is an electrostatic chuck provided at the lower electrode.

17. The plasma processing apparatus of claim 14, wherein the resistor is formed in tight contact with a plasma-side surface of a dielectric layer that is brought in tight contact with a plasma-side surface of the plate-shaped dielectric material.

18. An electrode for use in a plasma processing apparatus that applies high frequency power to the electrode to generate plasma of a gas and performs a plasma processing on a target object by using the generated plasma,
wherein the electrode is an upper electrode disposed to face a lower electrode with a plasma processing space defined therebetween, and
the electrode comprises:
a base formed of a metal;
a plate-shaped dielectric material provided at a central portion of a plasma-side of the base, the plate-shaped dielectric material being shaped as a plate without having a tapered edge; and
a resistor provided between the plate-shaped dielectric material and the processing space plasma and configured to make an impedance at a central portion of the electrode gradually larger than that at a peripheral portion of the electrode, the resistor being formed of a metal and the resistor is not in contact with the plate shaped dielectric material;
wherein the plate-shaped dielectric material is provided only at a central portion of the plasma-side of the base and the resistor is disposed substantially only within a region directly beneath the plate-shaped dielectric material.

19. The plasma processing apparatus of claim 18, wherein the resistor is formed in tight contact with a plasma-side surface of a dielectric layer that is brought in tight contact with a plasma-side surface of the plate-shaped dielectric material.

20. The plasma processing apparatus of claim 18, wherein the resistor is not connected to any power supply.

* * * * *